(12) United States Patent
Kirkland et al.

(10) Patent No.: US 10,304,710 B2
(45) Date of Patent: May 28, 2019

(54) FRONT OPENING WAFER CONTAINER WITH WEIGHT BALLAST

(71) Applicant: ENTEGRIS, INC., Billerica, MA (US)

(72) Inventors: Eric A. Kirkland, Colorado Springs, CO (US); Barry Gregerson, Deephaven, MN (US); Eric S. Olson, Shorewood, MN (US); Christian Andersen, Carver, MN (US); Jason Todd Steffens, Shakopee, MN (US); Ryan Mushel, Chaska, MN (US); Karen Anderson, Lonsdale, MN (US)

(73) Assignee: Entegris, Inc., Billerica, MA (US)

( * ) Notice: Subject to any disclaimer, the term of this patent is extended or adjusted under 35 U.S.C. 154(b) by 5 days.

(21) Appl. No.: 14/899,423

(22) PCT Filed: Jun. 18, 2014

(86) PCT No.: PCT/US2014/043014
§ 371 (c)(1),
(2) Date: Dec. 17, 2015

(87) PCT Pub. No.: WO2014/205121
PCT Pub. Date: Dec. 24, 2014

(65) Prior Publication Data
US 2016/0141194 A1    May 19, 2016

Related U.S. Application Data

(60) Provisional application No. 61/836,572, filed on Jun. 18, 2013.

(51) Int. Cl.
*H01L 21/673* (2006.01)

(52) U.S. Cl.
CPC .. *H01L 21/67379* (2013.01); *H01L 21/67369* (2013.01); *H01L 21/67376* (2013.01); *H01L 21/67383* (2013.01); *H01L 21/67386* (2013.01)

(58) Field of Classification Search
CPC ............................................. B65D 2543/00564
(Continued)

(56) References Cited

U.S. PATENT DOCUMENTS 3,351,192 A * 11/1967 La Plante ................ B65D 1/36
                                                                    206/486
5,368,186 A * 11/1994 Yeh ..................... A47G 19/2272
                                                                    220/378

(Continued)

FOREIGN PATENT DOCUMENTS

| CN | 1615248 A1 | 5/2005 |
| CN | 1774377 A | 5/2006 |

(Continued)

*Primary Examiner* — Mollie Impink
(74) *Attorney, Agent, or Firm* — Entegris, Inc.

(57) ABSTRACT

Apparatuses and methods providing a ballast system for adjusting the center of gravity of a standardized front opening wafer container. Various embodiments of the disclosure present ballast systems that are low profile, do not require modifications to the shell of the wafer container, and can be retrofit to existing wafer carriers. In some embodiments, these capabilities are accomplished by a ballast that mounts to a kinematic coupling plate of the wafer container. In one embodiment, the ballasting can also provide sufficient counter force to the lifting forces associated with purging of the wafer container, thereby preventing "lift off" of the wafer container during purging operations. The ballasts can be removed for shipping of the wafer container, thereby decreasing shipping costs.

20 Claims, 20 Drawing Sheets

(58) Field of Classification Search
USPC ...... 206/710; 220/795; 414/217, 217.1, 935, 414/940
See application file for complete search history.

(56) References Cited

U.S. PATENT DOCUMENTS

| | | | |
|---|---|---|---|
| 6,131,760 A * | 10/2000 | Huang | B65D 25/04 |
| | | | 220/326 |
| 6,712,213 B2 | 3/2004 | Eggum | |
| 6,811,029 B2 | 11/2004 | Eggum | |
| 7,201,276 B2 | 4/2007 | Burns et al. | |
| 2005/0105997 A1* | 5/2005 | Englhardt | H01L 21/6732 |
| | | | 414/626 |
| 2008/0260498 A1 | 10/2008 | Nagata et al. | |
| 2013/0032509 A1 | 2/2013 | Yamagishi et al. | |

FOREIGN PATENT DOCUMENTS

| | | | | |
|---|---|---|---|---|
| CN | 101981684 A | 2/2011 | | |
| CN | 102844853 A | 12/2012 | | |
| EP | 2 562 801 A1 | 2/2013 | | |
| JP | S55-99690 | 7/1980 | | |
| JP | S59-784 | 1/1984 | | |
| JP | 2006-100712 A | 4/2006 | | |
| JP | 2012-114371 A | 6/2012 | | |
| WO | 2005/101484 A1 | 10/2005 | | |
| WO | 2011/132553 A1 | 10/2011 | | |
| WO | 2011/072260 A3 | 11/2011 | | |
| WO | WO 2013025629 A2 * | 2/2013 | ....... | H01L 21/67369 |

* cited by examiner

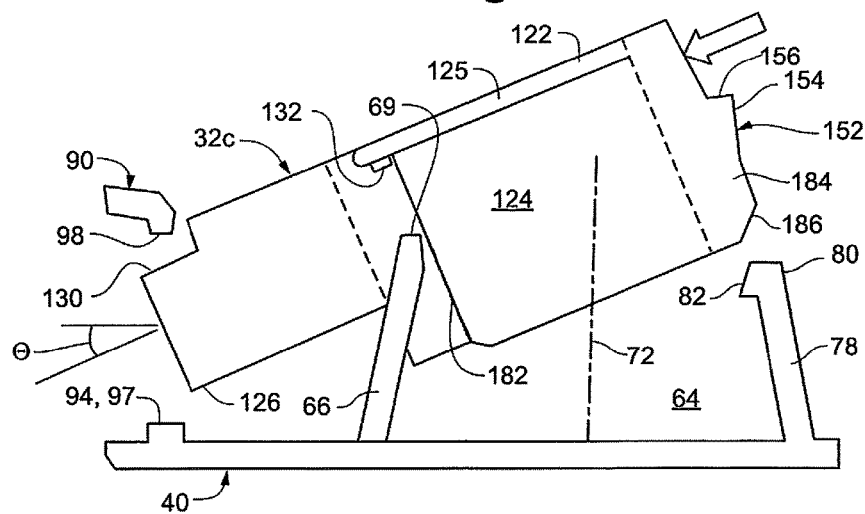
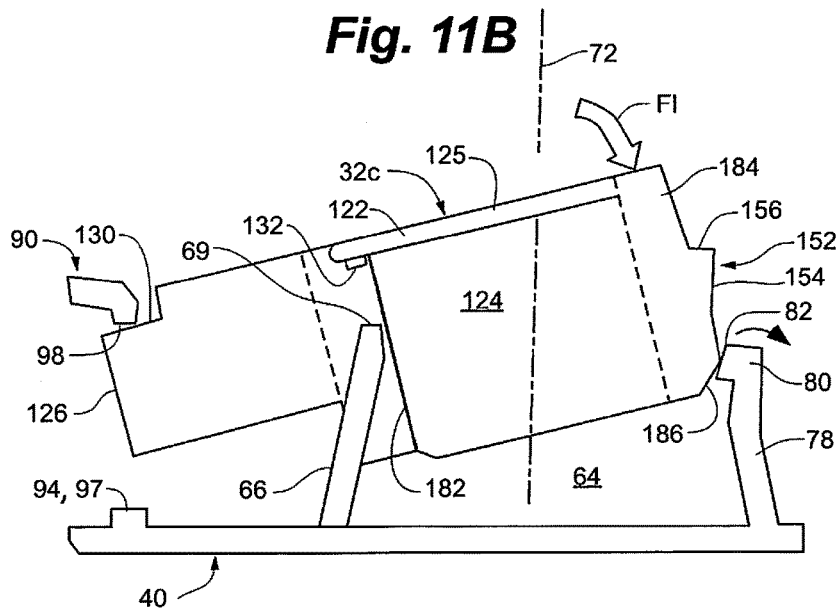

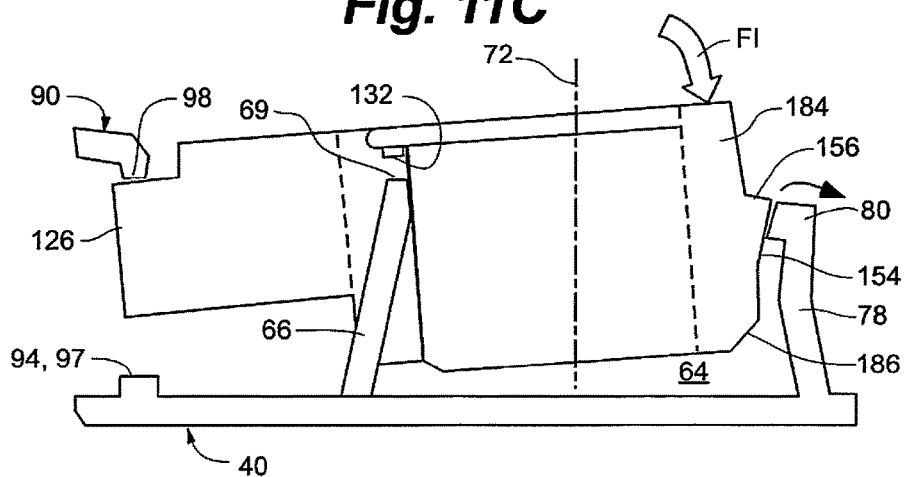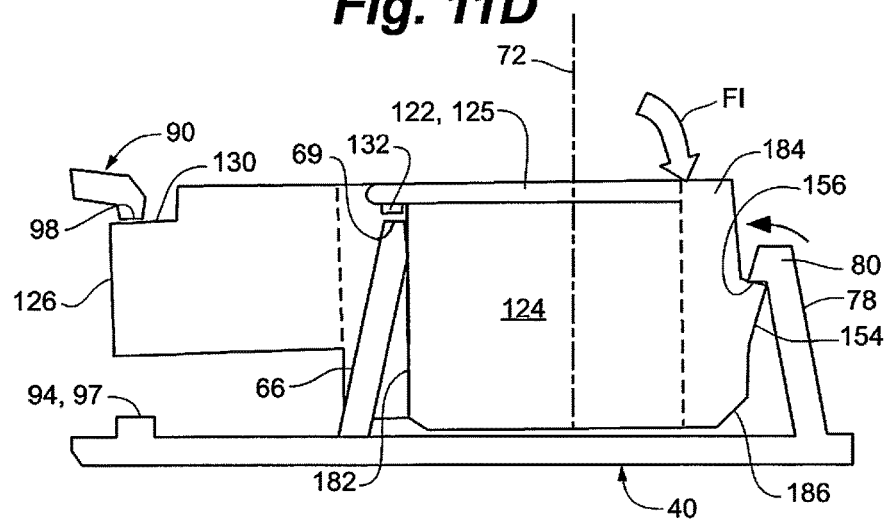

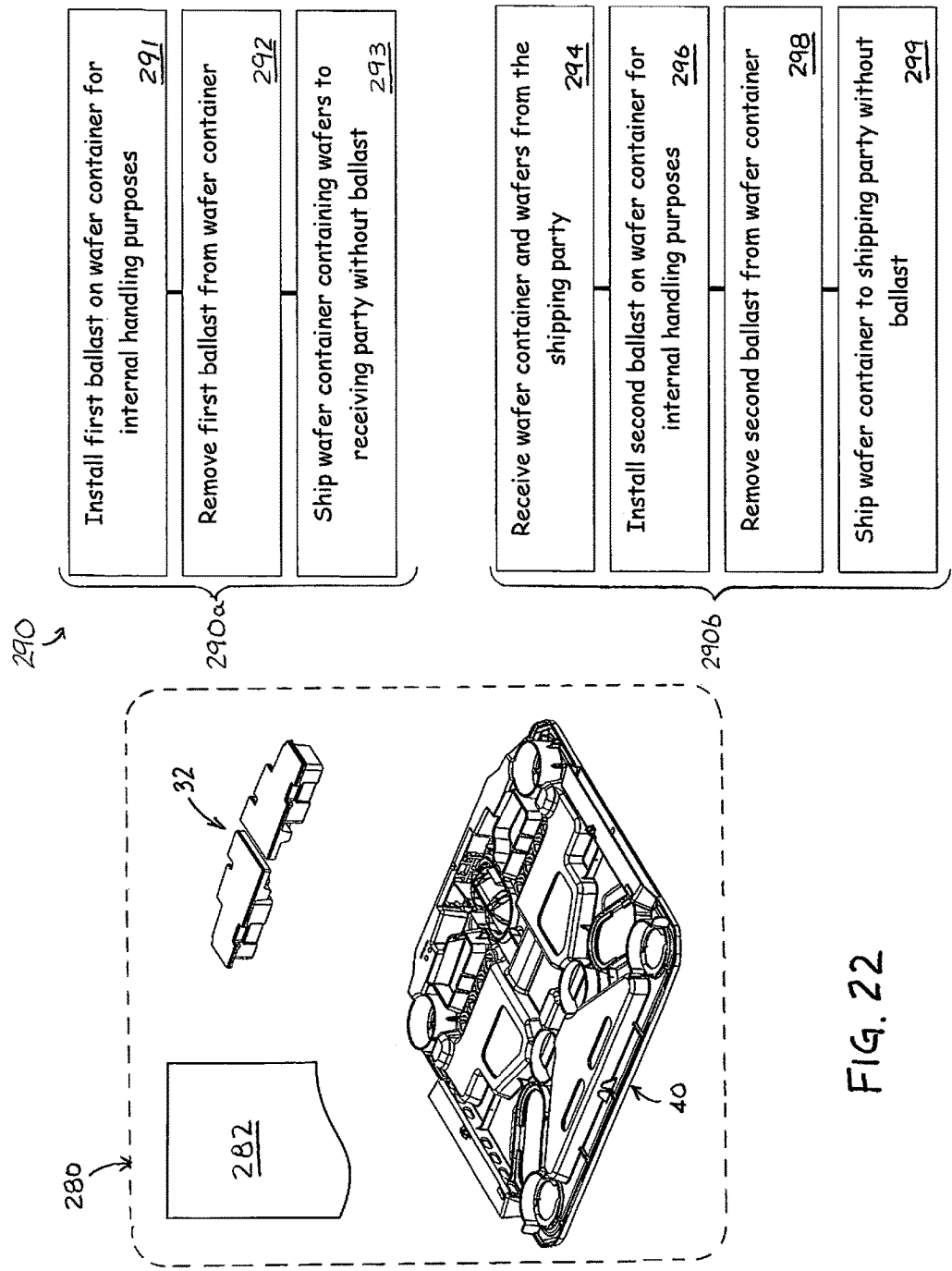

FRONT OPENING WAFER CONTAINER WITH WEIGHT BALLAST

RELATED APPLICATIONS

This present application is a National Phase entry of PCT Application No. PCT/US2014/043014, filed Jun. 18, 2014, which claims priority to U.S. Provisional Patent Application No. 61/836,572, filed Jun. 18, 2013, the disclosures of which are incorporated by reference herein in their entirety.

FIELD OF THE DISCLOSURE

The disclosure is directed generally to wafer containers and more specifically to front opening wafer containers with weight ballast capabilities.

BACKGROUND OF THE DISCLOSURE

As the number of circuits per unit area has increased in integrated circuits, particulates have become more of an issue associated with semiconductor wafers during their conversion into the integrated circuits. The size of particulates that can destroy a circuit has decreased and is approaching the molecular level. Particulate control is necessary during all phases of manufacturing, processing, transporting, and storage of semiconductor wafers. Particle generation during insertion and removal of wafers into carriers and from movement of wafers in carriers during transport needs to be minimized or avoided. Wafer containers are washed to remove particulates that have accumulated during use. Such containers need to be constructed to minimize any contamination issues associated with said washing. Such issues include areas that do not immediately dry after washing and contaminants introduced by washing fluids coming into contact with metallic components. Driven by economies of scale, the size of wafers utilized in semiconductor fabrication facilities ("fabs") has continually increased. Currently there are a number of fabs that process 300 mm wafers and fabs for 450 mm wafers are being developed.

The 300 mm and 450 mm diameter wafers are carried and handled with front opening wafer containers. Contained within is a spaced stack of horizontally oriented wafers supported by shelves and wafer restraints. The bottom of the container has kinematic coupling to precisely seat on a machine interface with cooperating kinematic coupling projections and a robotic flange for grasping and conveying of the containers. The front opening wafer containers include a door that is disposed on a forward side of the wafer carrier. The door is sealingly coupled to and seated within in a frame. The door and frame present added weight at the front extremity of the wafer container, causing a significant moment arm that causes the wafer container to pitch forward. That is, the center of gravity of the wafer container is substantially ahead of the geometric center of wafer container, even when the wafer container is fully loaded. Door opening and closing, and wafer removal and insertion are all accomplished robotically. Precise, stable, and secure seating of the front opening wafer container on the machine interface is imperative. Issues associated with precise seating and stability that may be present in 300 mm wafer containers are exacerbated with the 450 mm containers due to the greater expanses of plastic, thicker walls, and significantly greater weight.

The bottom kinematic coupling is typically provided on a kinematic coupling plate that has three aligned slots that seat on a kinematic coupling comprising three rounded projections arranged in a triangle for precise location of the kinematic coupling plate. A central axis extends through the center of a square robotic flange positioned on the top of the container. The central axis also passes through a centrally located position between the three aligned slots and the three projections engaged with the slots when the carriers are seated. In some instances, the central axis extends vertically through the stack of spaced wafers in both 300 mm and 450 mm front opening containers.

It is advantageous for stability and optimal seating to have the center of gravity of the wafer container positioned at or in close proximity to the central axis that corresponds to a center of the three projections of the kinematic coupling and the center of the square robotic flange on the top of the wafer containers. Accordingly, certain aspects of the 300 mm and 450 mm containers have been standardized by industry standards promulgated by Semiconductor Equipment and Materials International ("SEMI"), know as SEMI standards. SEMI standards E158 and E159 specify that the center of gravity be within a certain distance of the central axis of the robotic flange in a direction that is forward of the central axis, "forward" being in a direction towards the door of the wafer container. For example, the center of gravity is specified to be within 29 mm of the central axis in the forward direction for 450 mm Front Opening Unified Pods ("FOUPs"), and within 39 mm of the central axis in the forward direction for 450 mm Multiple Application Carriers ("MACs").

A system that can be implemented with both new and existing wafer containers to adjust the position of the center of gravity of front opening wafer containers would be a welcomed addition to the wafer container art.

SUMMARY OF THE DISCLOSURE

Disclosed herein are various apparatuses and methods providing a ballast system for adjusting the center of gravity of a standardized front opening wafer container. Various embodiments of the disclosure present ballast systems that are low profile, do not require modifications to the shell of the wafer container, and can be retrofit to existing wafer carriers. In some embodiments, these capabilities are accomplished by a ballast that mounts to a kinematic coupling plate of the wafer container. In one embodiment, the ballasting can also provide sufficient counter force to the lifting forces associated with purging of the wafer container, thereby preventing "lift off" of the wafer container during purging operations.

Large diameter front opening wafer containers (e.g., for housing 300 mm and 450 mm diameter wafers) are typically formed from injection molded polymers and have a container portion with an open front and a door to sealing close the open front. A door frame defining the open front and the door with wafer restraints and latching mechanisms add substantially more volume of polymer and thus weight to the front of the wafer container compared to the structure at the rear of the wafer container which essentially has a closed wall and a wafer restraint. The forward weight due to the additional forward polymer structures of the door and door frame moves the center of gravity of the wafer container forward from the central axis of the wafer stack and the center of the kinematic coupling projections and grooves sufficiently to negatively affect stability and the optimal seating of the wafer container on the kinematic coupling projections. Moreover, such forward shifting also moves the center of gravity forwardly with respect to the robotic flange creating potential uneven static and dynamic loading issues when the container is transported by the robotic flange.

U.S. Patent Application Publication No. 2013/0032509 to Yamagishi et al. ("Yamagishi") discloses substrate storage containers that include heavy gravity center position adjustment members at the rear portion of the wafer container body such as on a rear wall or a side wall rear portion so that inclination of the substrate container body toward the lid side of the container is regulated with the gravity center position adjustment member. Certain configurations of Yamagishi require an expansion of the outer boundaries of the storage container; others are low profile (i.e., do not expand the outer boundaries of the storage container) but require modification to the container portion such that the container portion would have to be replaced. Furthermore, certain configurations of Yamagishi include structural features that interfere with implementation of other innovations in wafer container art. For example, certain low profile configurations of Yamagishi could interfere with or affect the performance of various purge towers, such as disclosed at WO 2011/072260 to Burns et al., effectively precluding use of these performance enhancing devices. By implementing a low profile ballast that does not require modification to the shell of the wafer container, various embodiments of the present disclosure address these shortcomings of Yamagishi.

There are also additional technical considerations for the ballasting of wafer containers other than the resulting COG position. For example, the ballast can function to counter the forces that result from purging of the container. Front opening wafer containers are commonly purged with nitrogen or extremely dry air that is ported in through features in the rear underside of the container, and exhausted through features on the front underside. For certain applications, such as in conventional stockers used for longer term storage of the wafer container, the container is not positively secured by hold down clamps. The purge flow creates upward forces in the rear and front of the wafer container, which can be great enough to lift the wafer container, particularly where the wafer container is housing only a few wafers.

The addition of the ballast can help to prevent the wafer container from raising off its supports while being purged. In extreme situations, (e.g., a single wafer present and a very high purge flow rate), a higher ballast weight may be required than would otherwise be required to simply bring the COG position within acceptable limits.

Structurally, the wafer container according to various embodiments of the disclosure comprises a ballast that includes material more dense that the polymer comprising the walls of the container portion and/or the kinematic coupling plate that shifts the center of gravity towards or proximate to the vertical axis of a wafer stack in the container. The ballast can also include an inert exterior polymer surface. In one embodiment, the ballast comprises a plate spanning across the kinematic coupling plate at the bottom of the container portion that is securely captured between the kinematic coupling plate and the shell of the wafer container. In an embodiment the ballast plate attaches to the kinematic coupling plate with spring catches and may be sandwiched between the kinematic coupling plate and the container portion. The ballast plate may be configured as an elongate bar or plate extending laterally and positioned proximate a rear side of the kinematic coupling plate and rear side of the container portion. The ballast plate may be formed of a high density material that supplements the structural strength of the polymer in the kinematic coupling plate and/or the container portion. In some embodiments, the ballast comprises a solid plate or elongate block of metal material, such as stainless steel, zinc, lead, or other metal, or weighted material that is contained within an encapsulation. The encapsulation may be provided by, for example, a polymer powder coating.

In one embodiment, a ballast system for a wafer container comprises a ballast that includes a plate portion including an outer periphery and a first core portion depending from the plate portion, the first core portion comprising a weight material and having a first exterior surface shaped and dimensioned for insertion into a kinematic coupling plate. The ballast can further comprises a second core portion depending from the plate portion, the second core portion having a second exterior surface shaped and dimensioned for insertion into a kinematic coupling plate. The ballast can further comprise at least one rib depending from the plate portion, the at least one rib portion being disposed between the first core portion and the second core portion. The at least one rib can be contoured for accommodation of a back side of a kinematic coupling on a kinematic coupling plate. In one embodiment, a first exterior surface of the ballast defines contact features proximate the first core portion for engagement with a kinematic coupling plate. The ballast can further comprise a protrusion extending beyond the outer periphery of the plate portion for coupling with a kinematic coupling plate. The first core portion can be inset from the outer periphery of the plate portion to define flange portions. The ballast can also include a coating of a polymer material. The first core portion includes an engagement portion for engagement with a retention feature on a kinematic coupling plate. In one embodiment, the engagement portion is a clip engagement portion including a lead-in structure and a catch surface.

In various embodiments, a kinematic coupling plate includes a first receiving portion and a second receiving portion, at least one of the first receiving portion and the second receiving portion being shaped and dimensioned to receive the ballast, the kinematic coupling plate including a bulkhead structure that defines an aperture that engages the protrusion. The kinematic coupling plate can also include a retention clip coupled with the clip engagement portion.

In certain embodiments, a ballast system for a wafer container comprises a ballast, including a first housing portion including a first tub portion and a first lid portion that cooperate to define a first main compartment, and a first primary weight comprising a weight material and disposed in the first main compartment. The first housing portion can include a first exterior surface shaped and dimensioned for insertion into a kinematic coupling plate. In one embodiment, the ballast further comprises a second housing portion including a second tub portion and a second lid portion that cooperate to define a second main compartment, and a second primary weight disposed in the second main compartment, the second housing portion including a second exterior surface shaped and dimensioned for insertion into a kinematic coupling plate. In some embodiments, the first housing portion and the second housing portion are connected by a bridge structure; in others, the first and second housing portions are separate, independent ballasts. The first housing portion can include structure defining a flange portion that extends horizontally from the first tub portion. The ballast can further comprise contact features that depend from the flange portion. The first housing can further define a first supplemental compartment that houses a secondary weight. The first supplemental compartment can be contoured for accommodation of a back side of a kinematic coupling on a kinematic coupling plate. The ballast can include a first engagement portion for engagement with a retention feature on a kinematic coupling plate, wherein the first engagement portion is integrally formed on an exterior surface of the first housing portion. The first engagement portion can be a clip engagement portion including a lead-in structure and a catch surface.

In one embodiment, a gasket is disposed interstitially between the first tub portion and the first lid portion. The housing portion can further define a plurality of notches, and the gasket portion can include a plurality of tab portions, each of the tab portions mating with a corresponding one of the plurality of notches. In one embodiment, the gasket includes a shim portion that extends between the first primary weight and the secondary weight.

In one embodiment, a kinematic coupling plate includes a first receiving portion and a second receiving portion, at least one of the first receiving portion and the second receiving portion being shaped and dimensioned to receive the ballast, the kinematic coupling plate including a first retention clip coupled with the clip engagement portion. The ballast can include a second engagement portion for engagement with a second retention feature on the kinematic coupling plate. The second engagement portion can be integrally formed on the exterior surface of the first housing portion. In one embodiment, the second engagement portion is a clip engagement portion including a lead-in structure and a catch surface. The second retention feature can be a second retention clip coupled with the second clip engagement portion. In one embodiment, the first retention clip is flexible in a first plane and the second retention clip is flexible in a second plane, the first plane being orthogonal to the second plane.

The kinematic coupling plate of various embodiments comprises a polymer. In some embodiments, the weight material of the ballast has a density that is at least twice a density of the polymer and not greater than 10 times the density of the polymer. In one embodiment, the density of the ballast portion is at least 2.5 times the density of the polymer. In one embodiment, the density of the ballast portion is at least 3 times the density of the polymer. In one embodiment, the density of the ballast portion is at least 3.5 times the density of the polymer. In one embodiment, the density of the ballast portion is at least 4 times the density of the polymer. In one embodiment, the density of the ballast portion is at least 4.5 times the density of the polymer. In one embodiment, the density of the ballast portion is at least 5 times the density of the polymer.

In various embodiments, the ballast of the ballast system weighs at least 1 kgf and not more than 12 kgf. In one embodiment, the ballast weighs at least 4.5 kgf. In one embodiment, the ballast weighs at least 6 kgf. In one embodiment, the ballast weighs at least 10 kgf.

In some embodiments, weight material of the ballast system has a density of at least 3000 kg/m$^3$ and not more than 14,000 kg/m$^3$. In one embodiment, the weight material has a density of at least 4000 kg/m$^3$. In one embodiment, the weight material has a density of at least 6000 kg/m$^3$.

In one embodiment of the disclosure, a system for purging a wafer container, comprises a front opening wafer container including a shell having rear panel opposite a door frame, with a top panel, a bottom panel, and opposing side panels extending from the rear panel to the door frame, the door frame being sealingly engaged with a door, and at least one inlet purge port and at least one outlet purge port defined on the bottom panel of the shell. A purging apparatus is operatively coupled with the at least one inlet purge port and the at least one outlet purge port. A ballast is operatively coupled with the front opening wafer container, the ballast being of a weight predetermined to prevent lift off of the wafer container when the purging apparatus is operated at a corresponding predetermined flow rate. The purge system can further comprise a kinematic coupling plate attached to the bottom panel of the shell, the ballast being attached to the kinematic coupling plate. In one embodiment, the ballast is disposed proximate the back panel of the shell. In one embodiment, the purging apparatus is a stocker. In one embodiment, the weight of the ballast is predetermined to be sufficient to prevent lift off of the wafer container when only a single wafer is contained in the wafer container.

Likewise, a method for securing a wafer carrier to a purge apparatus is disclosed in an embodiment of the disclosure. The method comprises:
  providing a ballast for use with a wafer container, the ballast being of a predetermined weight suitable for retention of the wafer container on the purge apparatus at a predetermined purge gas flow rate;
  providing a set of instructions on a tangible medium, the set of instructions comprising: installing the ballast on the wafer container; and operatively coupling the wafer container on the purge apparatus after installing the ballast.

In one embodiment, the step of installing the ballast on the wafer container provided the set of instructions further comprises installing the ballast on a kinematic coupling plate of the wafer container. The method can further comprise
  providing a replacement kinematic coupling plate adapted to receive the ballast,
  wherein the set of instructions provided in the step of providing the set of instructions further comprises: removing an existing kinematic coupling plate from the wafer container; installing the ballast on the replacement kinematic coupling plate; and attaching the replacement kinematic coupling plate to the wafer container.

The weight of the ballast provided in the step of providing a ballast can be predetermined to be sufficient to prevent lift off of the wafer container when only a single wafer is contained in the wafer container.

In various embodiments of the disclosure, a wafer container is disclosed, comprising a shell having rear panel opposite a door frame, with a top panel, a bottom panel, and opposing side panels extending from the rear panel to the door frame, the door frame being sealingly engaged with a door. A robotic flange can be operatively coupled to the top panel of the shell, the robotic flange being centered about and normal to a central axis. A kinematic coupling plate can be operatively coupled with the bottom panel. A ballast is operatively coupled to the kinematic coupling plate proximate the rear panel. The kinematic coupling plate includes at least one receiving portion shaped and dimensioned to receive the ballast. In one embodiment, the ballast includes a plate portion including an outer periphery, and a first core portion depending from the plate portion, the first core portion comprising a weight material and having a first exterior surface shaped and dimensioned for insertion into the at least one receiving portion of the kinematic coupling plate. The ballast can further comprise a second core portion depending from the plate portion, the second core portion having a second exterior surface shaped and dimensioned for insertion into the kinematic coupling plate. In one embodiment, the ballast includes: a first housing portion including a first tub portion and a first lid portion that cooperate to define a first main compartment; and a first primary weight comprising a weight material and disposed in the first main compartment, the first housing portion including a first exterior surface shaped and dimensioned for insertion into a first of the at least one receiving portion of the kinematic coupling plate. The ballast of the wafer container can further comprise: a second housing portion including a second tub portion and a second lid portion that cooperate to define a second main compartment; and a second primary weight disposed in the second main compartment, the second housing portion including a second exterior surface shaped and dimensioned for insertion into a second of the at least one receiving portion of the kinematic coupling plate. In one embodiment, addition of the ballast to the wafer container moves a center of gravity of the wafer container to within 20 mm of the central axis. In various embodiments, the wafer container is configured to hold a stack of spaced 450 mm wafers about a vertical axis.

In various embodiments of the disclosure, a method is disclosed for providing ballasting of a front opening wafer container, comprising:

providing a ballast to a first party;
providing instructions on a tangible medium to a first party, the instructions comprising: receiving the front opening wafer container from a first party, the front opening wafer container including a kinematic coupling plate; and coupling the ballast to the kinematic coupling plate of the wafer container.

The step of coupling the ballast to the kinematic coupling plate in the set of instructions can further comprise:

removing the kinematic coupling plate from a shell of the wafer container;
installing the ballast on the kinematic coupling plate; and
attaching the kinematic coupling plate with the ballast installed to the shell of the wafer container.

The instructions can further comprise:

removing the ballast from the kinematic coupling plate; and
shipping the container back to the first party with the ballast removed.

In some embodiments of the disclosure, a weighted label plate may be attached to the rear outside of the container portion, said plate may be encapsulated by encasement into a polymer pocket with written information or indicia, such as bar codes, or may include RFID tags. Such weighted components shift the center of gravity rearwardly toward the weighted plate.

In some embodiments, the ballast portion extend left and right at least 50% of the width of the wafer container with the ballast portion centered with respect to left and right. In some embodiments, the ballast portion extend left and right at least 60% of the width of the wafer container with the ballast portion centered with respect to left and right. In some embodiments, the ballast portion extend left and right at least 65% of the width of the wafer container with the ballast portion centered with respect to left and right.

In certain embodiments of the disclosure, the ballast portion has a weight material that comprises metal and further comprises an encapsulation portion to preclude exposure of the metal. The encapsulation portion may be a polymer capsule overmolded over the ballast material, or the ballast material may be coated, such as by powder coating, with a polymer, or the ballast may be sealed inside a capsule by welding the capsule shut or by utilizing an o-ring seal or other gasket. The capsule can be integral with the shell or attached thereto, integral with the kinematic coupling plate or attached thereto, or captured therebetween.

In some embodiments, the wafer container can be convertible for use with and without the ballast portion. In some embodiments, the container is shipped to a use destination, for example a fabrication facility where the container will be seated on machine interfaces with kinematic couplings and/or transported by robotic flanges. At the use location, the ballast portion can be installed for secure seating on the machine interface and for secure transport by the robotic flange. In some embodiments the container is adapted to readily receive the ballast portion. In some embodiments, the ballast may be readily removed. In some embodiments, such installation and removal may be without hand tools, using for example, spring catches or manual sliding connections.

BRIEF DESCRIPTION OF THE DRAWINGS

FIGS. 11A through 11D is a schematic depiction of an installation of the heavy solid ballast into a kinematic coupling plate in an embodiment of the disclosure;

FIG. 22 is a schematic of a kit for retrofitting a wafer container with a ballast in an embodiment of the disclosure;

FIG. 23 is a flow chart of a supply method for providing ballasting of a wafer container in an embodiment of the disclosure;

DETAILED DESCRIPTION

Figure 1A:
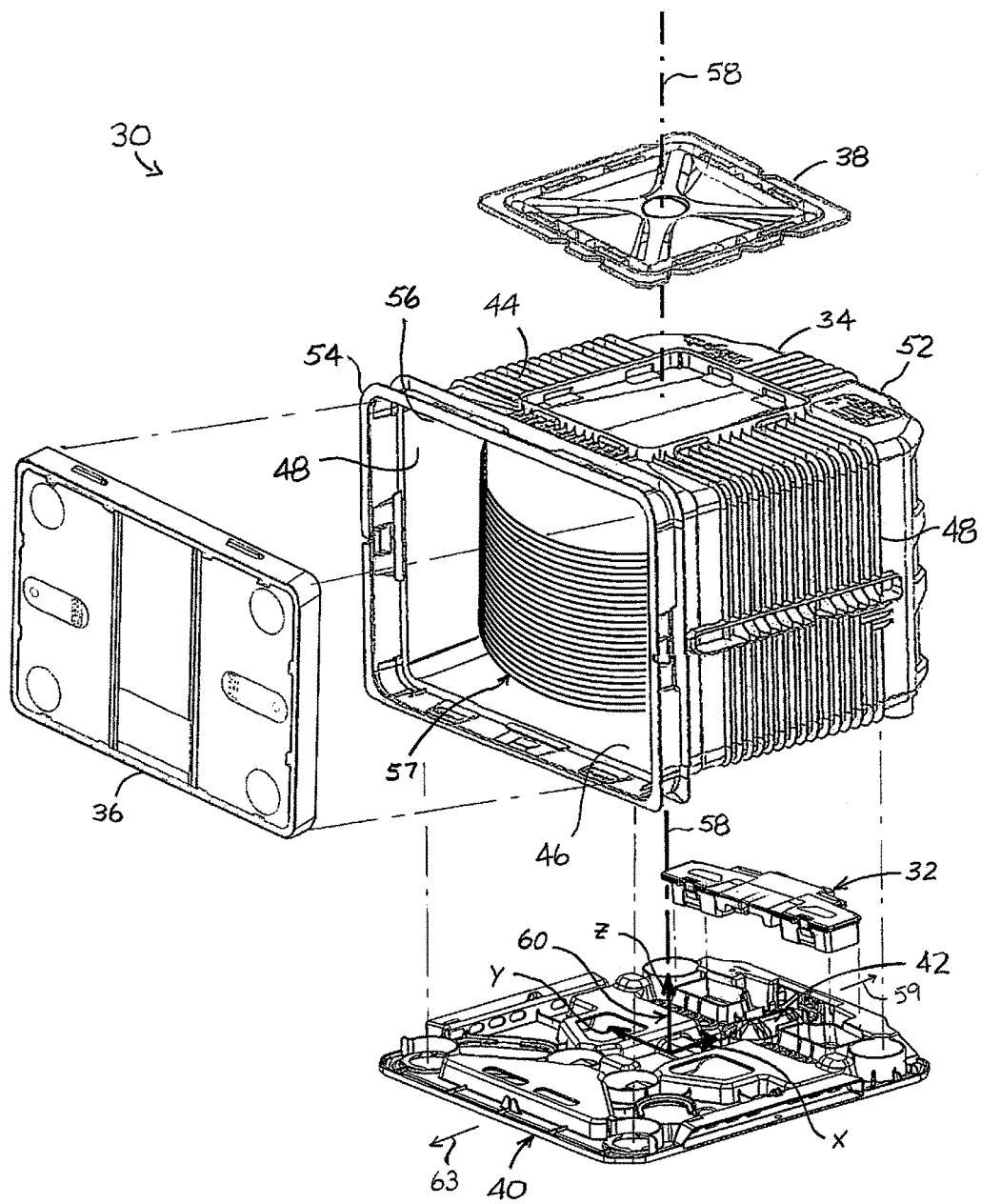
FIG. 1A is an exploded, front perspective view of a front opening wafer container in an embodiment of the disclosure.
Figure 1B:
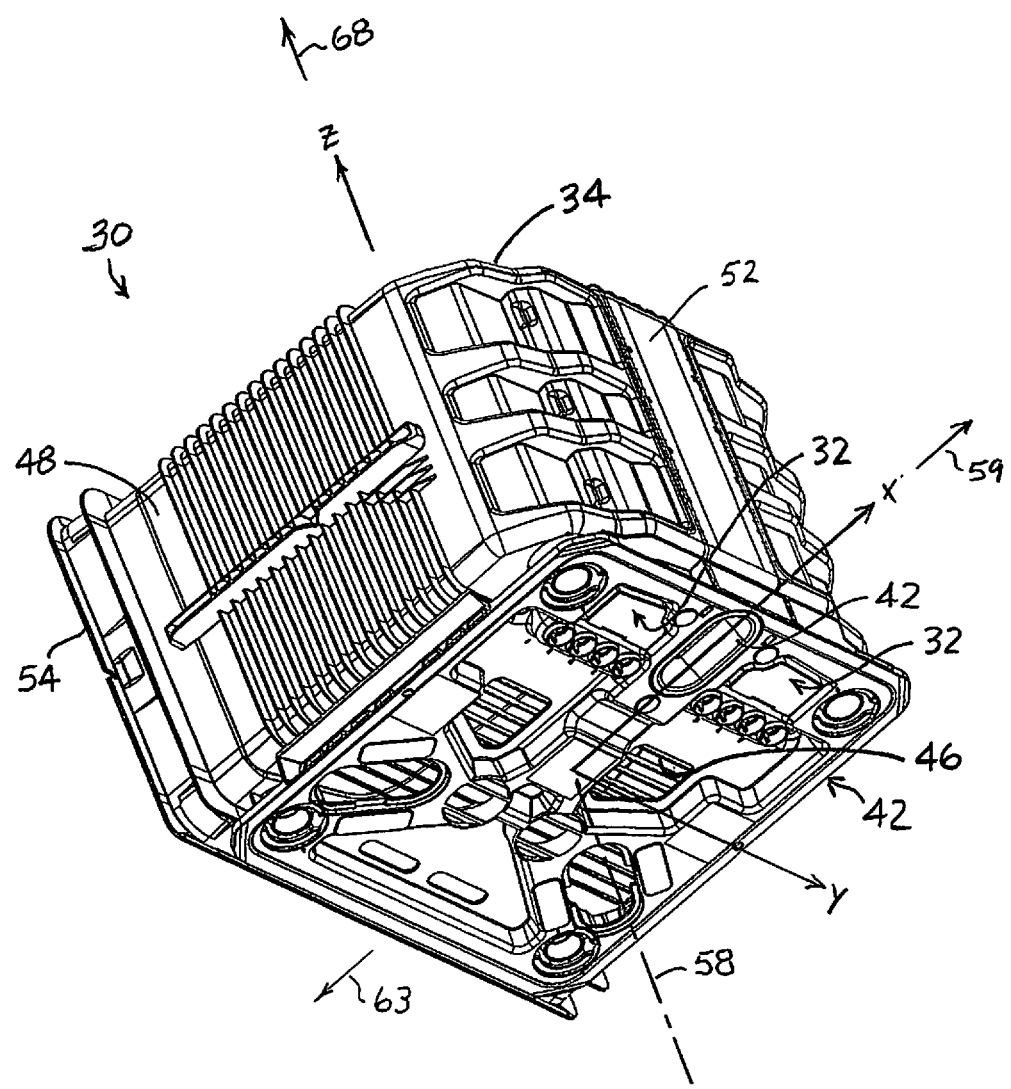
FIG. 1B is a rear-bottom perspective view of the assembled front opening wafer container of FIG. 1A in an embodiment of the disclosure.

Referring to FIG. 1, a front opening wafer container 30 with a ballast 32 is depicted in an embodiment of the disclosure. The front opening wafer container 30 comprises a shell or container portion 34, a removable door 36, a robotic flange 38, and a kinematic coupling plate 40 for housing a trio of kinematic couplings 42. The shell portion 34 includes a top panel 44 to which the robotic flange 38 is coupled, a bottom panel 46 to which the kinematic coupling plate 40 is coupled, opposing side panels 48, a rear panel 52, and a door frame 54 to which the removable door 36 can be operatively coupled and decoupled, the door frame 54 defining an access opening 56. In various embodiments, the ballast 32 is coupled to the kinematic coupling plate 40. In one embodiment, the ballast 32 is captured ("sandwiched") between the kinematic coupling plate 40 and the bottom panel 46 of the shell portion 34.

The front opening wafer container 30 is configured to carry a plurality of wafers 57 in a spaced apart manner. During handling, the wafer container is suspended from the robotic flange 38 that is centered about a central axis 58. A Cartesian coordinate system 60 can be defined thereby, with the z-coordinate being coincident with the central axis 58, the x-coordinate extending in a rearward direction 59 that is normal to the access opening 56, and the y-coordinate being normal to the x- and z-coordinates. In a so-called "upright position," the central axis 58 and z-coordinate are substantially vertical. For purposes of this patent application, the origin of the Cartesian coordinate system 60 is located within the kinematic coupling plate 40.

Figure 2A:
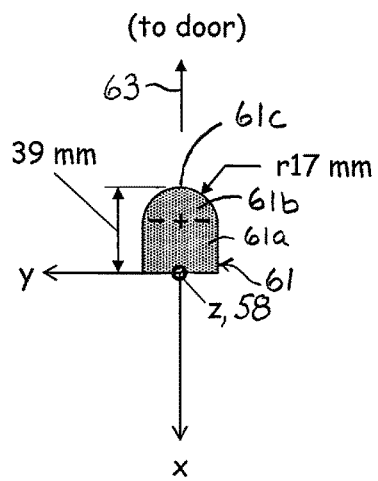
FIG. 2A is a schematic of the target area for location of the center of gravity of a 450 mm Multiple Application Carrier (MAC)
Figure 2B:
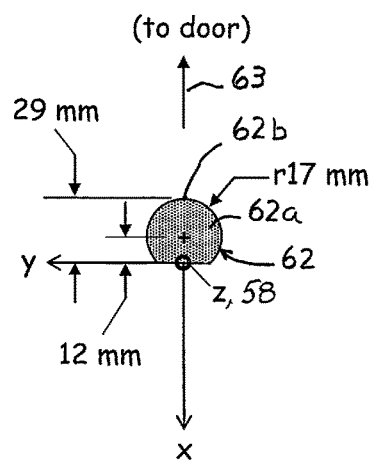
FIG. 2B is a schematic of the target area for location of the center of gravity of a 450 mm Front Opening Unified Pod (FOUP)

Referring to FIGS. 2A and 2B, schematics depicting target areas 61 and 62 for location of the center of gravity (COG) of 450 mm MACs and 450 mm FOUPs, respectively, are depicted. The target area 61 is specified by SEMI E159 and the target area 62 is defined by SEMI E158. The target area 61 for the 450 mm MAC is defined in a forward direction 63 of the z-coordinate (i.e., in the "negative x" direction) and defines a rectangular area 61a with a semi-circle 61b at a forward end 61c of the target area 61. The maximum length of the target area 61 is 39 mm, and is defined on the x-coordinate in the forward direction. The semi-circle defines a radius of 17 mm, with the resultant 34 mm diameter also defining the width of the rectangular area 61a.

The target area 62 for the 450 mm FOUP is defined by a portion of a circle 62a that is centered at a distance of 12 mm on the x-coordinate in the forward direction 63. The circle 62a has a radius of 17 mm, which combines with the 12 mm center location to define a maximum length of 29 mm defined on the x-coordinate in the forward direction.

Figure 3:
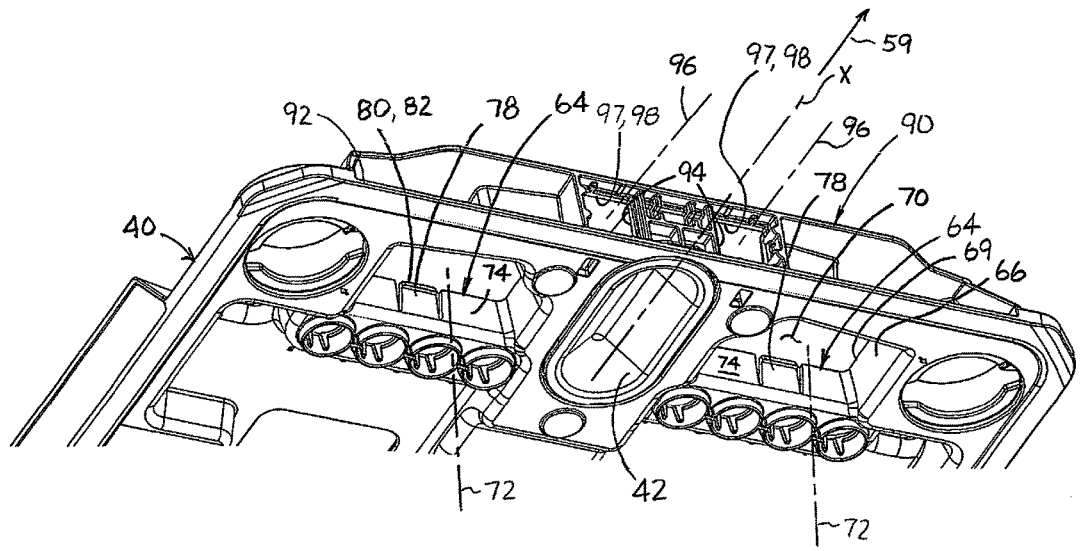
FIG. 3 is a partial, rear-bottom perspective view of a kinematic coupling plate in an embodiment of the disclosure.
Figure 4:
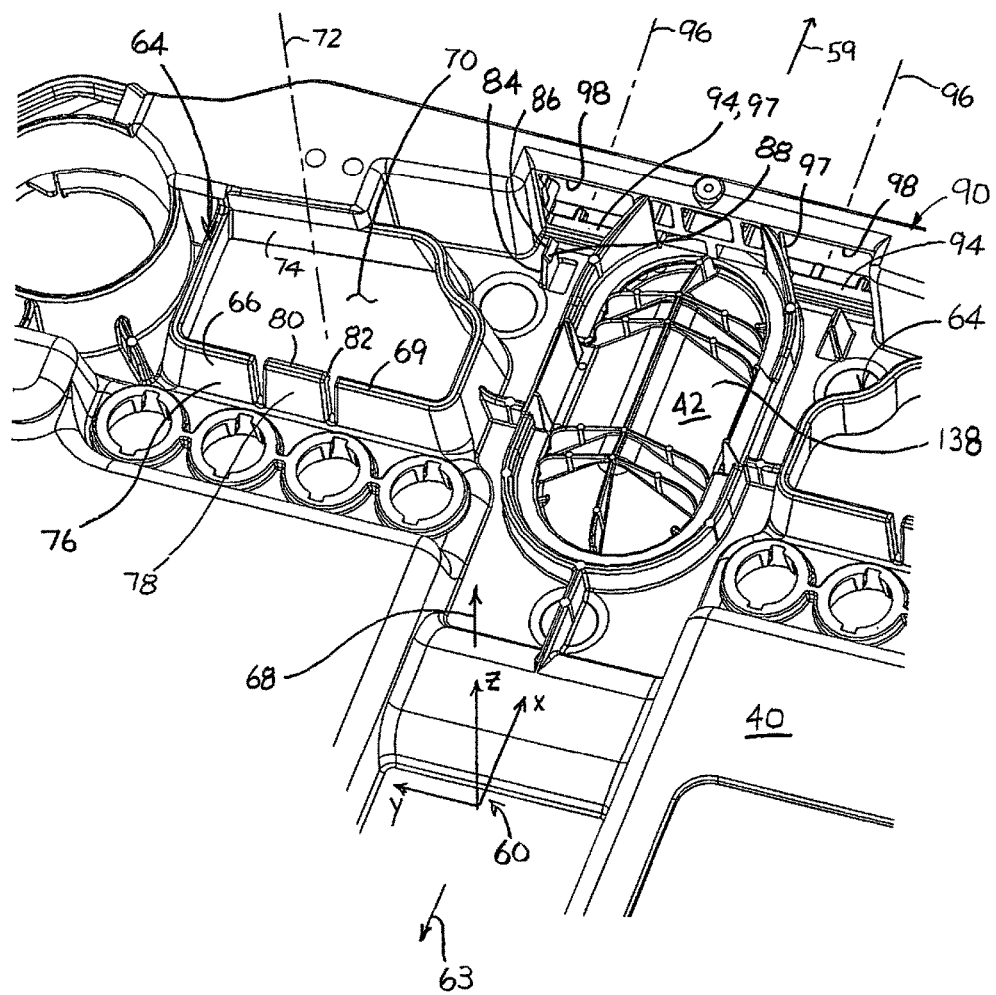
FIG. 4 is a partial, frontal-top perspective view of a kinematic coupling plate in an embodiment of the disclosure.

Referring to FIGS. 3 and 4, a rearward portion of the kinematic coupling plate 40 is depicted in an embodiment of the disclosure. The kinematic coupling plate 40 includes at least one receiving portion 64 for receiving the ballast 32. In one embodiment, each receiving portion 64 comprises a wall 66 that extends in an upward direction 68 to a top edge 69 when the front opening wafer container 30 is in an upright position. Each wall 66 thus extends between the kinematic coupling plate 40 and the bottom panel 46 of the shell portion 34. Each wall 66 at least partially surrounds an opening 70 defined in the kinematic coupling plate 40, the opening 70 defining a receiver axis 72 that is normal to the kinematic coupling plate 40. The wall 66 can define an interior surface 74 and an opposite exterior surface 76, the interior surface facing the receiver axis 72. In various embodiments, the kinematic coupling plate 40 includes one or more retention features such as a deflectable spring finger or retention clip 78 having a detent 80 that extends laterally over the opening 70 (i.e., in a direction towards the receiver axis 72), the detent 80 including a tapered face 82 that faces upward and towards the receiver axis 72.

Optionally, the ballast 32 can be coupled to the kinematic coupling plate 40 or the bottom panel 46 of the shell 34 with fasteners. In various embodiments, the kinematic coupling plate 40 includes a pair of receiving portions 64, each being a mirror image of the other about the x-z plane.

In various embodiments, the kinematic coupling plate 40 can include a pair of secondary retention clips 84 that extend in the upward direction 68. Each of the secondary retention clips 84 can include a detent 86 having a tapered face 88 that faces upward. The kinematic coupling plate 40 can also include a bulkhead 90 proximate a rearward edge 92 of the kinematic coupling plate 40. The bulkhead 90 can define a pair of apertures 94, each centered about a respective aperture axis 96, the aperture axes 96 being substantially parallel to the x-axis. Each aperture 94 is defined by a perimeter 97, the perimeter 97 including an upper edge 98. In one embodiment, the apertures 94 straddle the x-z plane and are each located equidistant therefrom. In one embodiment, the secondary retention clips 84 are disposed proximate to and are accessible through the apertures 94.

Referring to FIGS. 5 through 10, various configurations for the ballast 32 are depicted in embodiments of the disclosure. Herein, the ballasts are referred to collectively or generically by numerical reference 32, with the specific configurations referred to by numerical reference 32 followed by a letter suffix (e.g., 32b).

Figure 5:
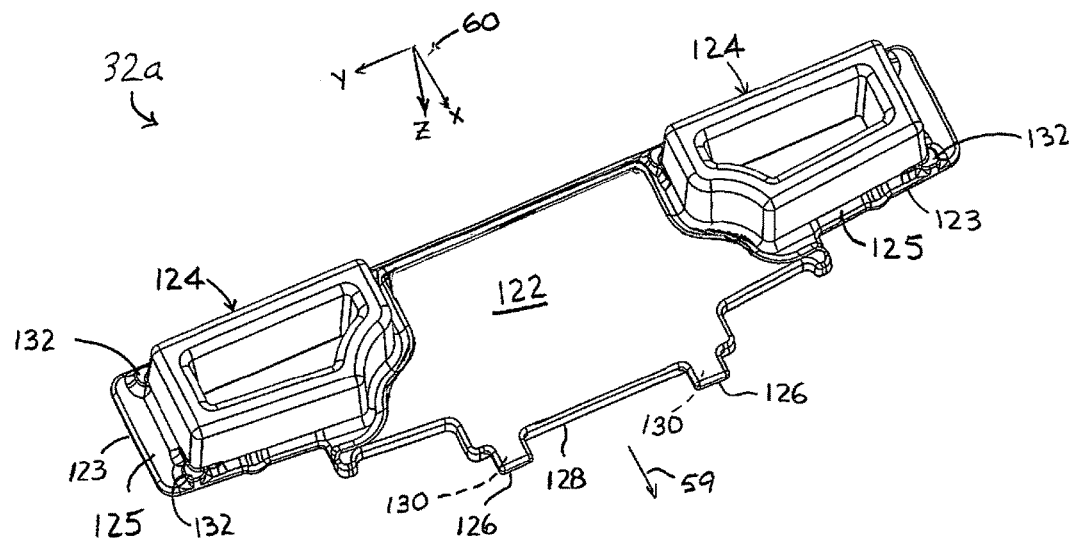
FIG. 5 is a bottom perspective view of a solid ballast in an embodiment of the disclosure.

A solid ballast 32a is depicted in FIG. 5. The solid ballast 32a includes a plate portion 122 from which depend a pair of core portions 124, the core portions 124 defining an exterior surface 121 that is shaped and dimensioned for seating within the receiving portions 64 of the kinematic coupling plate 40. The core portions 124 can be inset from an outer periphery 123 of the plate portion 122 to define flange portions 125 that extend beyond the core portions 124 in the x-y plane. In one embodiment, the solid ballast 32a includes a pair of protrusions 126 that, in assembly, extend in the rearward direction 59 beyond a rearward edge 128 of the outer periphery 123 of the plate portion 122. Each protrusion 126 is characterized as having an upper surface 130. The solid ballast 32a can further include a plurality of contact features 132 that depend from the flange portions 125, and which can be proximate the corners of the core portions 124.

Figure 6:
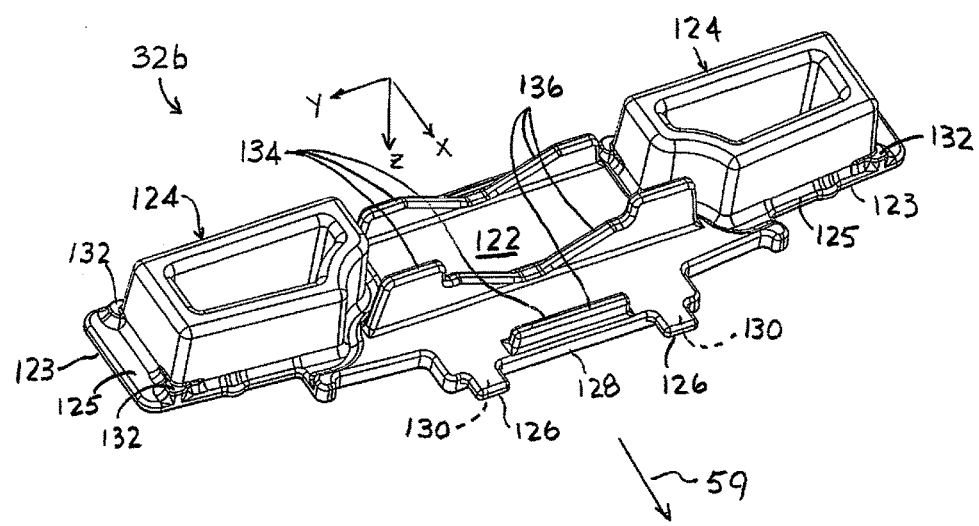
FIG. 6 is a bottom perspective view of a ribbed solid ballast in an embodiment of the disclosure.
Figure 7:
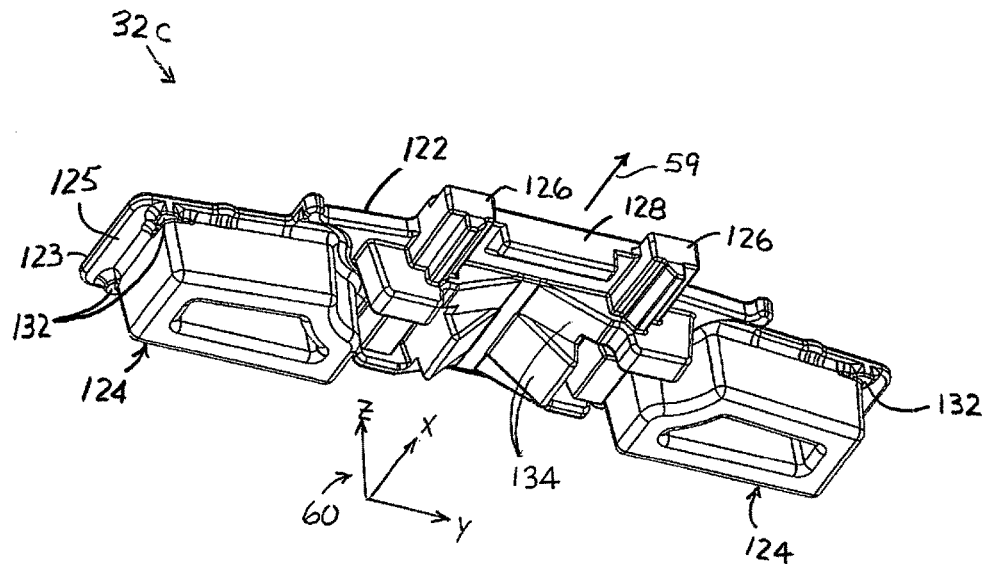
FIG. 7 is a bottom perspective view of the heavy solid ballast in an embodiment of the disclosure.

A ribbed solid ballast 32b is depicted in FIG. 6. The ribbed solid ballast 32b includes many of the same attributes as the solid ballast 32a, which are indicated with same-numbered numerical references. The ribbed solid ballast 32b further includes at least one rib 134 that depends from the plate portion 122. The rib(s) 134 include distal edges 136. In one embodiment, the distal edges 136 are contoured to accommodate a back side 138 of the kinematic coupling 42 (FIG. 4) that, in assembly, is disposed between the core portions 124.

Functionally, the rib(s) 134 can reduce warpage of the plate portion 122 for certain fabrication processes. For casting processes, the ribs can reduce warpage in both the wax and the cast state. In one embodiment, the contoured distal edges 136 enable placement of the ribbed solid ballast 32b without contacting or otherwise affecting the kinematic coupling 42. In other embodiments (not depicted), the contoured distal edges can lend support to the kinematic coupling 42.

A heavy solid ballast 32c is depicted in FIGS. 7 through 10, and includes many of the same attributes as the solid ballasts 32a and 32b, which are indicated with same-numbered numerical references. Also, those of skill in the art will recognize that the various aspects of the heavy solid ballast 32c can be incorporated into the heavy solid ballast 32a and 32b. The concept of the heavy solid ballast 32c is to increase the bulk in order to increase the weight provided by the ballast 32. Accordingly, the various elements of the heavy solid ballast 32c, such as the ribs 134 and the protrusions 126, are of increased thickness. In the depicted embodiment for the heavy solid ballast 32c, the "ribs" 134 are so thick that they run together (i.e., there is not gap therebetween).

Figure 8:
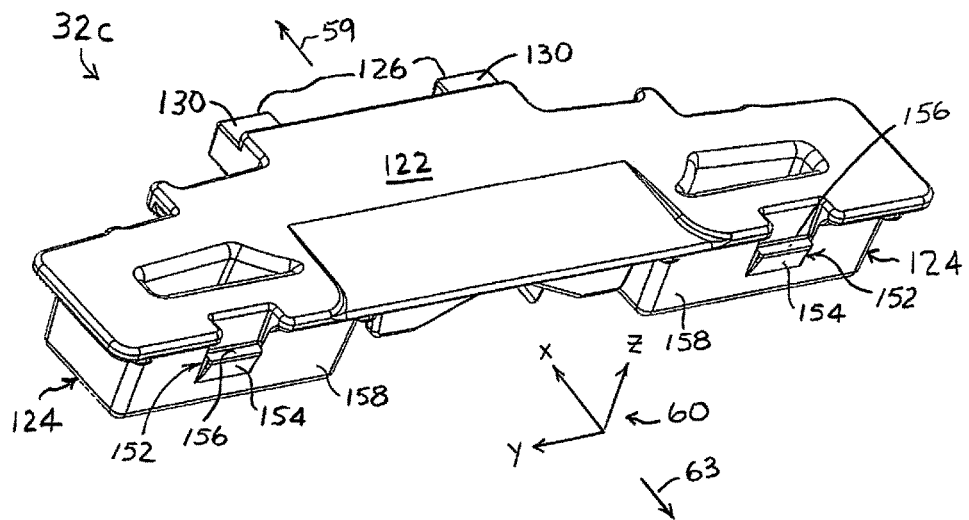
FIG. 8 is a top perspective view of the heavy solid ballast in an embodiment of the disclosure.

In various embodiments, the ballasts 32 include clip engagement portions 152, as depicted in FIG. 8 for the heavy solid ballast 32c. Each clip engagement portion 152 can include a lead-in structure 154 and a catch surface 156. In the depicted embodiments, the clip engagement portions 152 are disposed on a forward face 158 of the core portions 124 for engagement with the retention clip 78.

Figure 9:
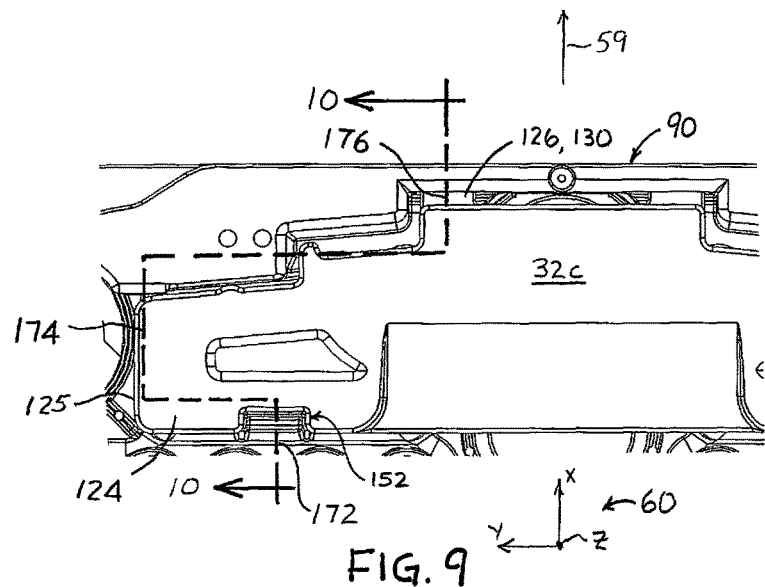
FIG. 9 is a partial plan view of an assembly of the heavy solid ballast installed in the kinematic coupling plate in an embodiment of the disclosure.
Figure 10:
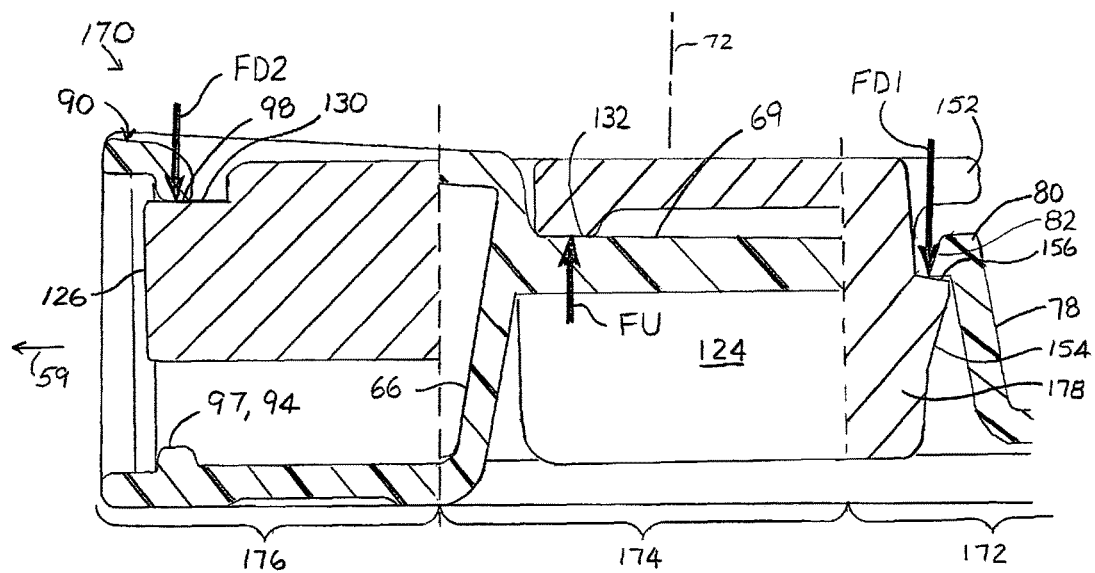
FIG. 10 is a composite sectional view of the assembly of FIG. 9.
Figure 12A:
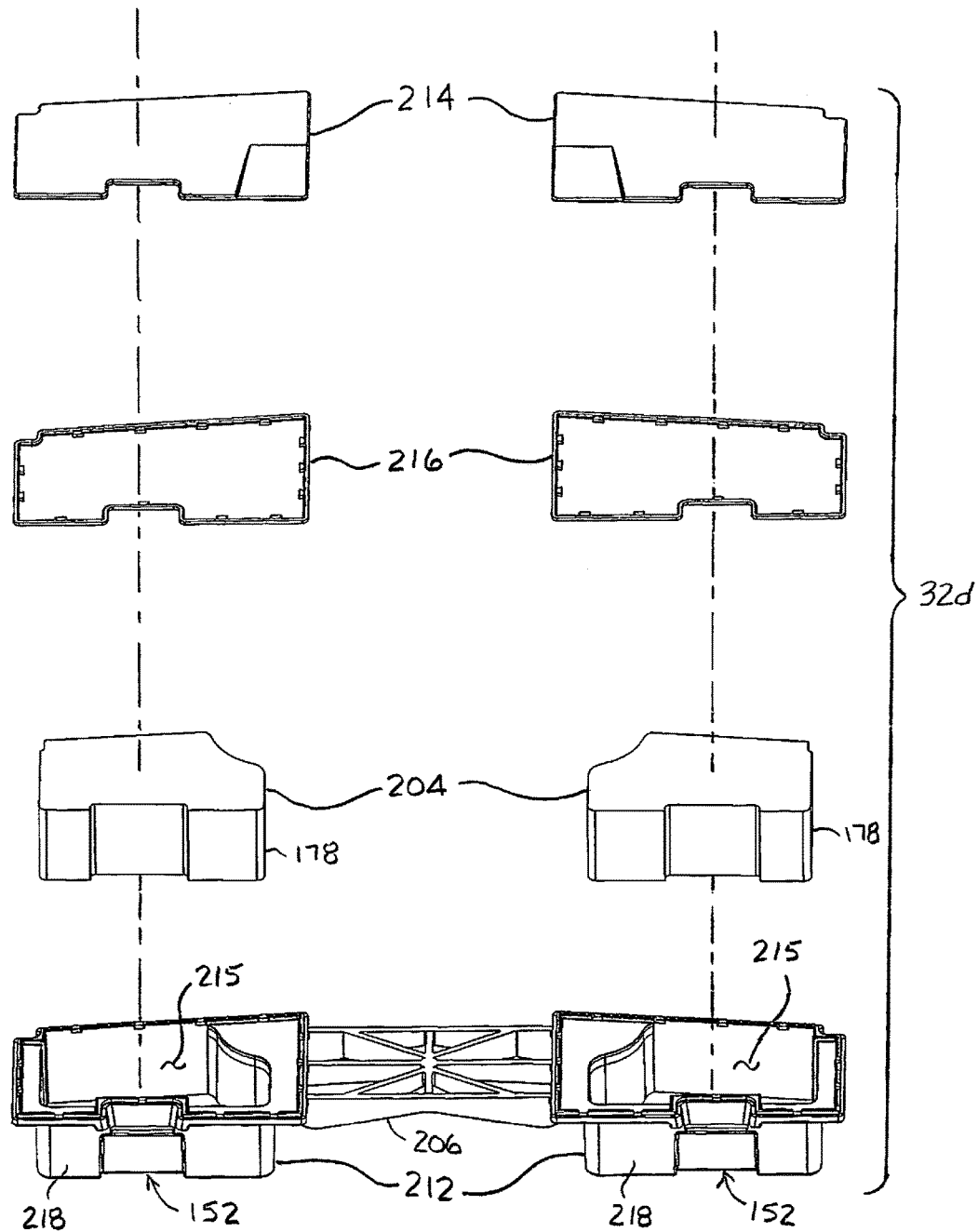
FIG. 12A is an exploded, front perspective view of an assembled ballast in an embodiment of the disclosure.
Figure 12B:
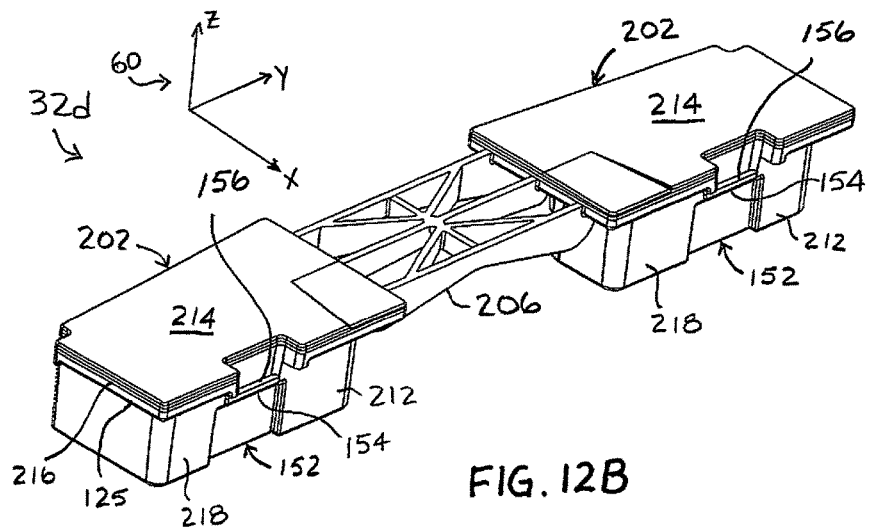
FIG. 12B is a front perspective view of the assembled ballast of FIG. 12A.
Figure 13:
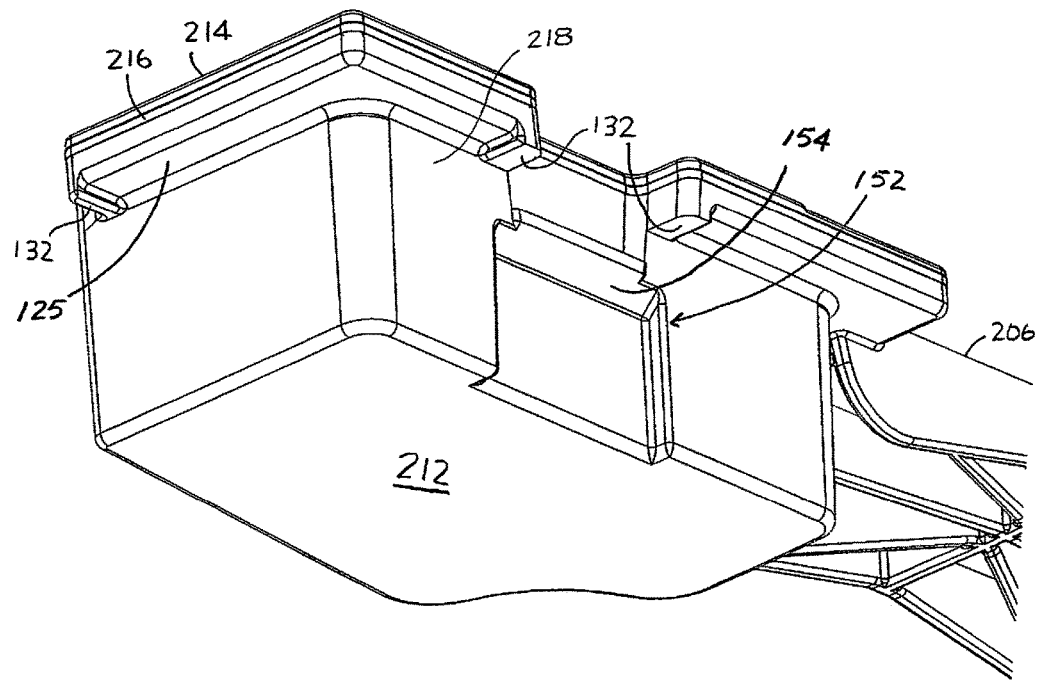
FIG. 13 is a partial, frontal-bottom perspective view of the assembled ballast of FIG. 12B.
Figure 14:
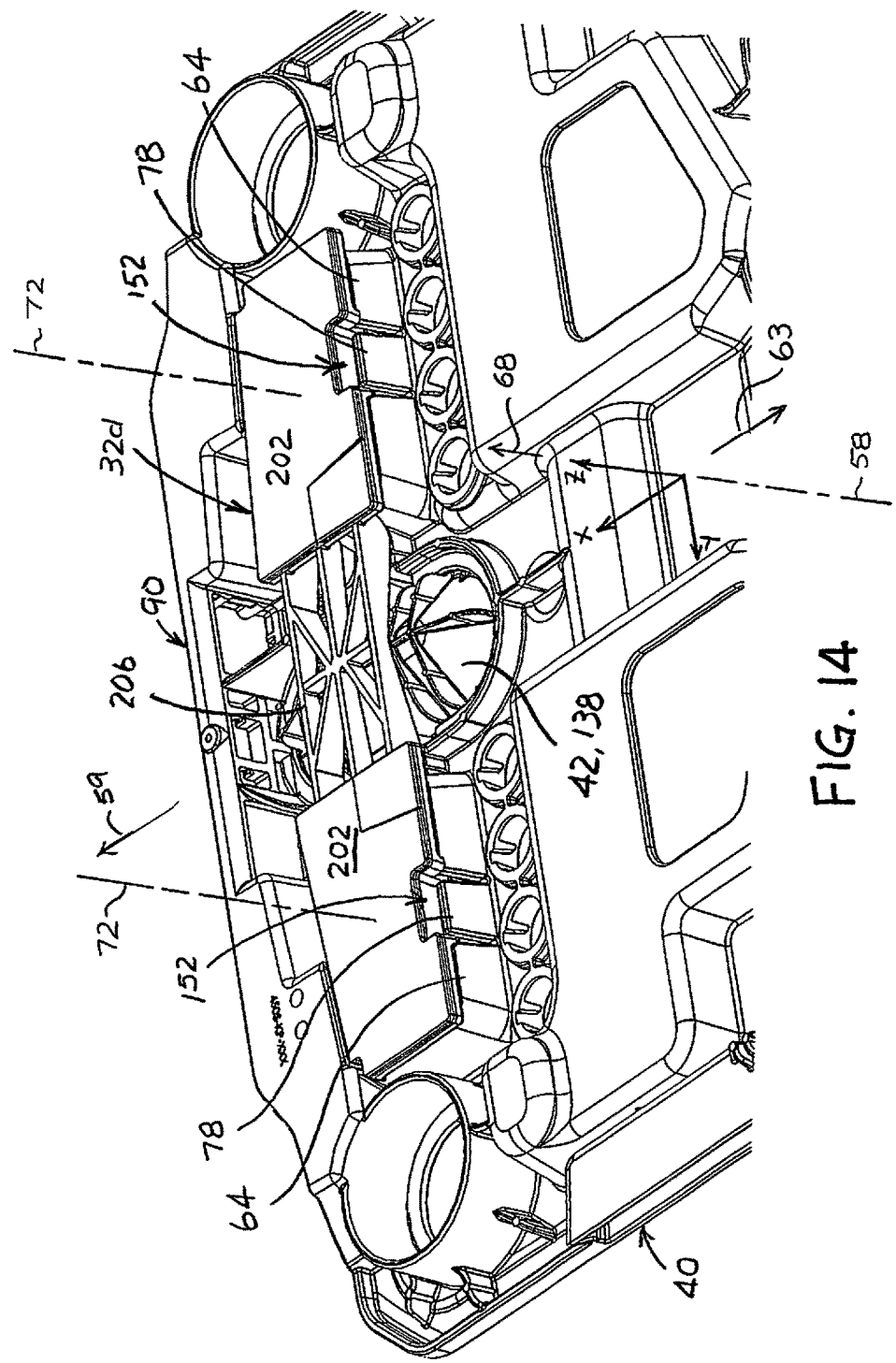
FIG. 14 is a partial, frontal-top perspective view of the assembled ballast of FIG. 12B installed in a kinematic coupling plate in an embodiment of the disclosure.
Figure 15B:
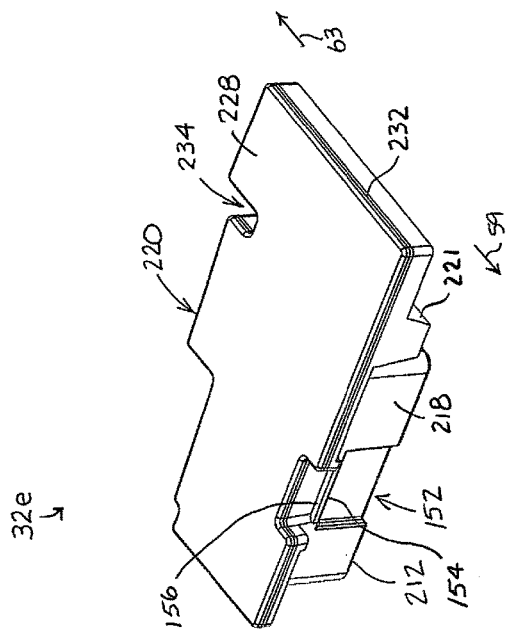
FIG. 15B is a front perspective view of the expanded assembled ballast of FIG. 15A.
Figure 15A:
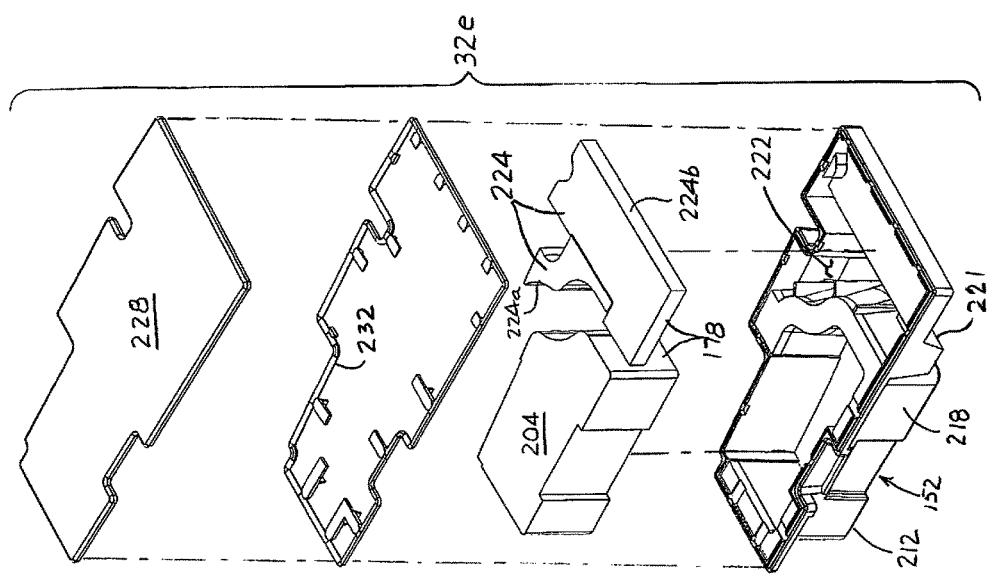
FIG. 15A is an exploded, front perspective view of an expanded assembled ballast in an embodiment of the disclosure.
Figure 16:
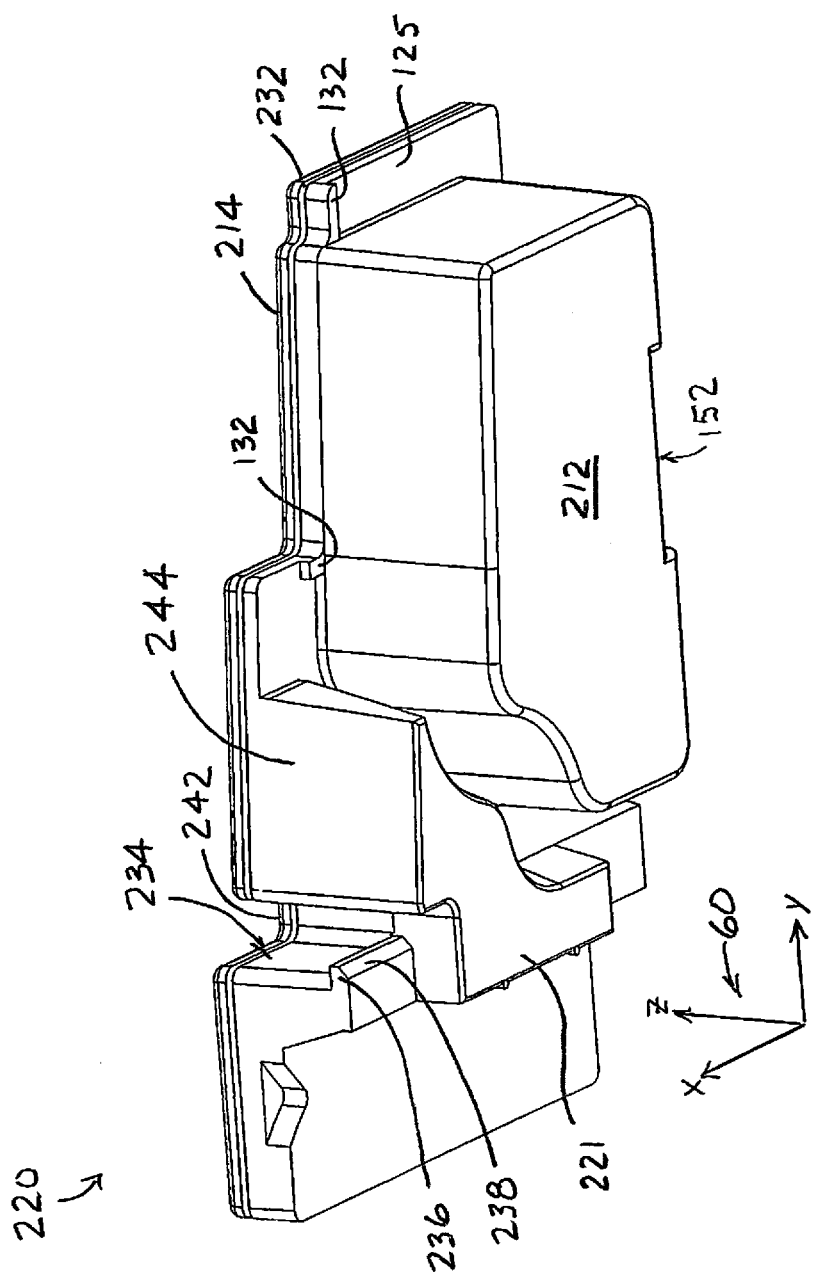
FIG. 16 is a frontal-bottom perspective view of the expanded assembled ballast of FIG. 15B.

In FIGS. 9 and 10, a composite sectional view 170 of the heavy solid ballast 32c secured within one of the receiving portions 64 of the kinematic coupling plate 40 is depicted. The composite sectional view 170 includes a first section 172 that depicts one of the retention clips 78 and clip engagement portions 152 in cross-section, a second section 174 that depicts one of the contact features 132 in cross-section, and a third section 176 that depicts one of the protrusions 126 and the bulkhead 90 in cross-section.

In the composite sectional view 170, the detent 80 of the retention clip 78 is in engagement with the catch surface 156 of the clip engagement portion 152. The contact feature 132 is registered against the top edge 69 of the wall 66. The protrusion 126 extends through the aperture 94, with the upper surface 130 of the protrusion 126 contacting the upper edge 98 of the perimeter 97 of the aperture 94.

Accordingly, the heavy solid ballast 32c is held within receiving portions 64 by downward forces FD1 and FD2, FD1 being exerted by the retention clip 78 on the catch surface 156, and FD2 being exerted by the upper edge 98 of the perimeter 97 of the aperture 94 on the upper surface 130 of the protrusion 126. A reactive upward force FU acts on contact features 132 of the heavy solid ballast 32c, exerted by the top edge 69 of the wall 66.

Referring to FIGS. 11A through 11D, installation of the heavy solid ballast 32c is schematically depicted in an embodiment of the disclosure. The dashed lines represent the division of the first, second, and third sections 172, 174, and 176 of FIGS. 9 and 10. Certain anatomical details have been removed or modified for purposes of clarity. To install, the protrusions 126 of the heavy solid ballast 32c are fed through the apertures 94 at an inclined angle B relative to horizontal (i.e., relative to the x-y plane), with a rearward face 182 of each core portion 124 contacting or nearly contacting the wall 66 of the receiving portions 64 (FIG. 11A).

Forward ends 184 of the core portions 124 are then pushed downward with an insertion force FI into the receiving portions 64, causing the heavy solid ballast 32c to rotate towards a horizontal orientation (i.e., an orientation where the plate portion 122 is substantially parallel with the x-y plane). As the heavy solid ballast 32c is so rotated, the protrusions 126 engage the upper edge 98 of the perimeter 97 of the aperture 94 and the rearward face 182 of each core portion 124 bears against the wall 66 of the receiving portion 64. Also, the lower forward corners 186 of the core portions 124 engage the tapered face 82 of the detent 80 of the retention clip 78, causing the retention clip 78 to flex away from the receiver axis 72 (FIG. 11B). As the insertion force FI continues to be applied, the lead-in structure 154 is slid onto the detent 80, with the protrusions 126 continuing to engage the upper edges 98 of the perimeters 97 of the apertures 94, the rearward faces 182 of the core portions 124 continuing to bear against the walls 66 of the receiving portions 64, and the retention clips 78 continuing to flex away from the receiver axis 72 (FIG. 11C).

As the lead-in structure 154 slides past the detent 80, the retention clip 78 snaps into place, with the detent 80 registering on the catch surface 156 of the clip engagement portion 152. The heavy solid ballast 32c, the receiving portions 64, and bulkhead 90 are dimensioned so that, when the retention clip 78 is registered within the clip engagement portion 152, contact features 132 are registered on the top edge 69 of the wall 66 and the upper surfaces 130 of the protrusions 126 are registered against the upper edges 98 of the perimeters 97 of the apertures 94 (FIG. 11D).

To release the heavy solid ballast 32c from the receiving portion 64, the detent 80 is disengaged from the catch surface 156 of the engagement portion 152 and the heavy solid ballast 32c rotated away from the receiving portion 64 in a sequence that is essentially the reverse of FIGS. 11A through 11D. Disengagement of the retention clip 78 can be accomplished, for example, by a prying operation wherein a tool (not depicted) is inserted between the tapered face 82 of the detent 80 and the forward face 158 of the core portions 124 to facilitate the prying operation.

While the heavy solid ballast 32c is depicted and discussed in relation to the depictions of FIGS. 9 through 11D, it is noted that the same aspects and concepts can be applied to the solid ballasts 32a and 32c, or any other ballast 32 having engagement portions 152 and protrusions 126.

The solid ballasts 32a-32c are formed from a weight material 178 which can comprise a metallic material, such as stainless steel, zinc or zinc-based alloys, lead, or powdered metal. The weight materials 178 can be formed by various processes, including investment casting, metal injection molding, sand casting, powdered metal, and forging, with the ballasts being machined as necessary to achieve desired tolerances.

In some embodiments, the solid ballasts 32a-32c are coated with an inert material such as many polymers typically used in semiconductor wafer containers. In one embodiment, the coating is provided by a powder coating process. Considerations for the coating selection include adherence to the solid material (e.g., adherence to stainless steel), corrosion resistance, abrasion resistance, non-wetting/hydrophobic characteristics, low and repeatable build thickness, and the ability to fully coat the component (i.e., be free of fixture points). Examples of coatings having desirable characteristics for stainless steel include: ENDURA 202P Nickel Matrix infused with fluoropolymer shell; ENDURA 311 M PFA; IMPREGLON T-60 PFA; Orion Industries ETFE (TEFZEL); Orion Industries ECTFE (HALAR); PARYLENE HT conformal coating; E-COAT.

Referring to FIGS. 12A through 14, an assembled ballast 32d is depicted in an embodiment of the disclosure. The assembled ballast 32d includes a pair of housing portions 202 that each contain a primary weight 204 formed of the weight material 178. The weight material 178 can comprise any of the aforementioned materials utilized for the solid ballasts 32a-32c. In addition, because of the use of the encapsulated housing portions 202, these materials can take on a granular form, such as spheres, pellets, or shot.

In one embodiment, the housing portions 202 are connected by a bridge structure 206 contoured to accommodate a back side 138 of the kinematic coupling 42. Each housing portion 202 includes a tub portion 212 and a lid portion 214 that cooperate to define a main compartment 215 therebetween. In one embodiment, a gasket 216 is disposed interstitially between the tub and lid portions 212, 214. An exterior 218 of each housing portion 202 can have many of the same aspects and components as the solid ballasts 32a-32c, which are indicated by same-numbered numerical references (e.g., flange portions 125, contact features 132, and clip engagement portions 152 with attendant lead-ins 154 and catch surfaces 156).

Referring to FIGS. 15A through 17, expanded assembled ballasts 32e are depicted in an embodiment of the disclosure. The expanded assembled ballast 32e include many of the same aspects and components as the assembled ballast 32d, which are indicated by same-numbered numerical references. The expanded assembled ballasts 32e includes an expanded housing 220. In addition to the tub portion 212 and primary weight 204, the expanded assembled ballasts 32e the expanded housing 220 of each expanded assembled ballast 32e includes a supplemental tub portion 221 that defines a supplemental compartment 222 for housing at least one secondary weight 224. The secondary weight(s) can be formed of the weight material 178. The expanded assembled ballast 32e further comprises a lid portion 228 and gasket 232 that are larger than the lid portion 214 and gasket 216 of the assembled ballast 32d to define both the main compartment 215 and the supplemental compartment 222. In one embodiment, the supplemental compartment 222 can be configured to extend over the kinematic coupling 42 in assembly. Also, in the depicted embodiment, the supplemental compartment 222 houses two secondary weights 224a and 224b.

Not all of the compartments 215, 222 of the expanded assembled ballast 32e need to house a weight. Weight selection and combination can be in accordance with particular ballasting requirements. For example, the expanded assembled ballast 32e might include only the primary weight 204 with only one of the secondary weights 224a or 224b; in another assembly, only the secondary weights 224a and 224b are encapsulated, with the main compartment 215 being left void; and so on. Accordingly, the expanded assembled ballast 32e provides a modular platform for ballast assembly.

The expanded assembled ballast 32e can include a secondary clip engagement portion 234 including a ledge portion 236 having a lead-in taper 238 that faces downward. In one embodiment, the secondary clip engagement portion 234 is disposed in a recess 242 that is formed on a rearward face 244 of the expanded assembled ballast 32e (for example, on the supplemental tub portion 221 as depicted). The recess 242 can be accessible from one or more of the top, bottom, and rear of the expanded assembled ballast 32e.

Figure 17:
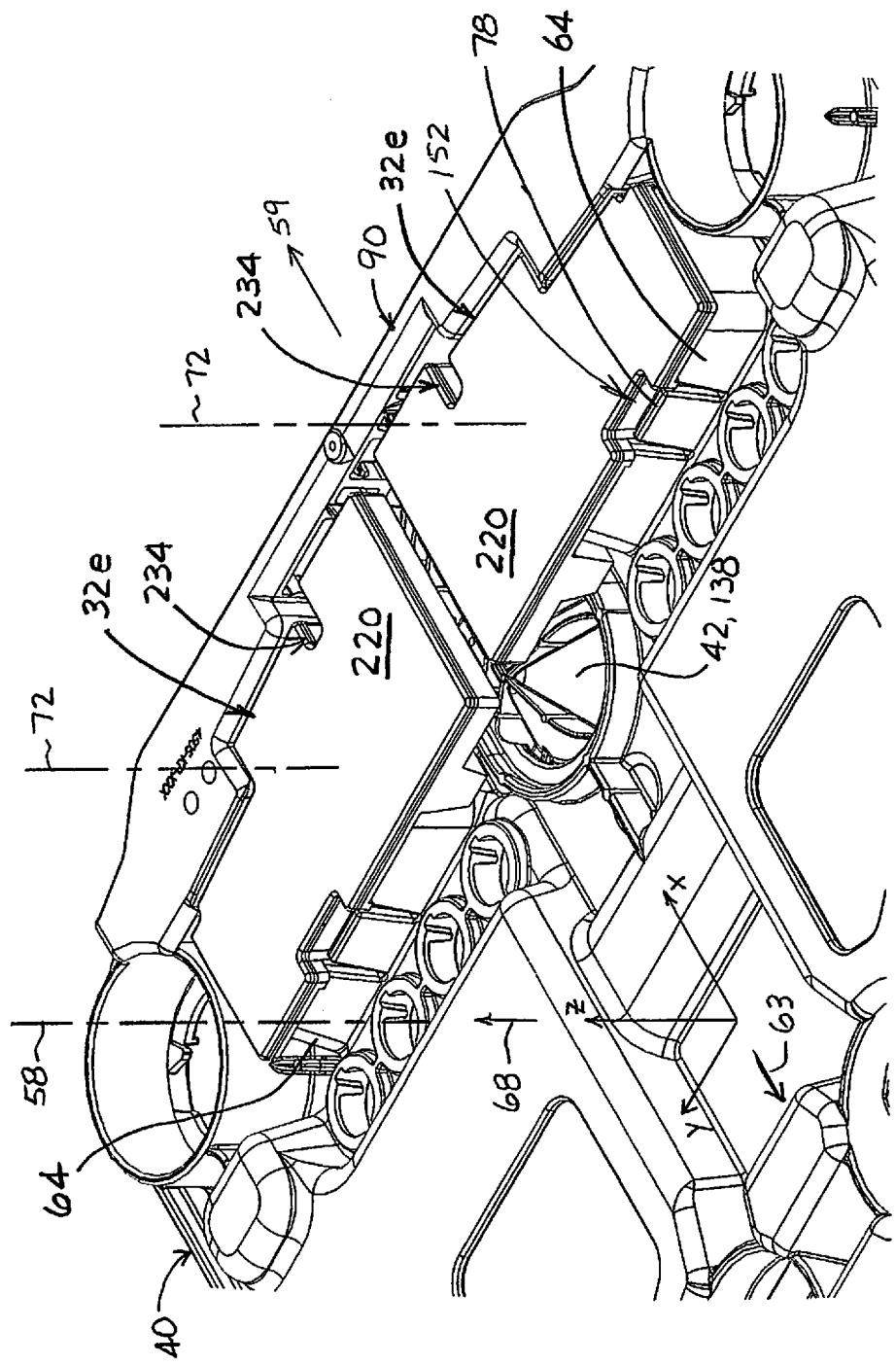
FIG. 17 is a partial, frontal-top perspective view of twin, expanded assembled installed in a kinematic coupling plate in an embodiment of the disclosure.

In one embodiment, the assembled ballasts 32d and 32e are not connected to each other (i.e., there is no bridge structure), as depicted in FIG. 17 for the assembled and installed ballasts 32e. Accordingly, in the depicted embodiment, there are twin assembled ballasts 32e, each being a mirror image of the other about the x-z plane.

In installation, the expanded assembled ballast 32e is aligned over the receiving portion 64 along the receiver axis 72 and oriented for complementary insertion into the receiving portion 64. The expanded assembled ballast 32e is then inserted into the receiving portion 64 and pushed downward, along the receiver axis 72. As the expanded assembled ballast 32e is translated downward, the lead-in structure 154 of the clip engagement portion 152 contacts the tapered face 82 of the retention clip 78, and the lead-in taper 238 of the secondary clip engagement portion 234 contacts the tapered face 88 of the secondary retention clip 84, respectively. The tapered faces 82 and 84 slide over the respective lead-ins 154 and 238, and snap into place to secure the expanded assembled ballast 32e within the receiving portion 64.

In one embodiment, the retention clips 78 and 84 are orthogonal to each other; likewise, the respective engagement portions 152 and 234 are also orthogonal to each other. By this arrangement, the locking action functions to positively retain the expanded assembled ballast 32e in both the x- and y-directions. That is, the retention clips 78 and 84 can be configured to be in a flexed state when the expanded assembled ballast 32e is disposed in the receiving portion 64, such that the retention clip 78 exerts a force against the engagement portion 152 in the rearward direction (parallel to the x-axis) and the secondary retention clip 84 exerts a force against the secondary engagement portion 234 in a lateral direction (parallel to the y-axis), both forces being countered by the wall portion 66 of the receiving portion 64.

Figure 18:
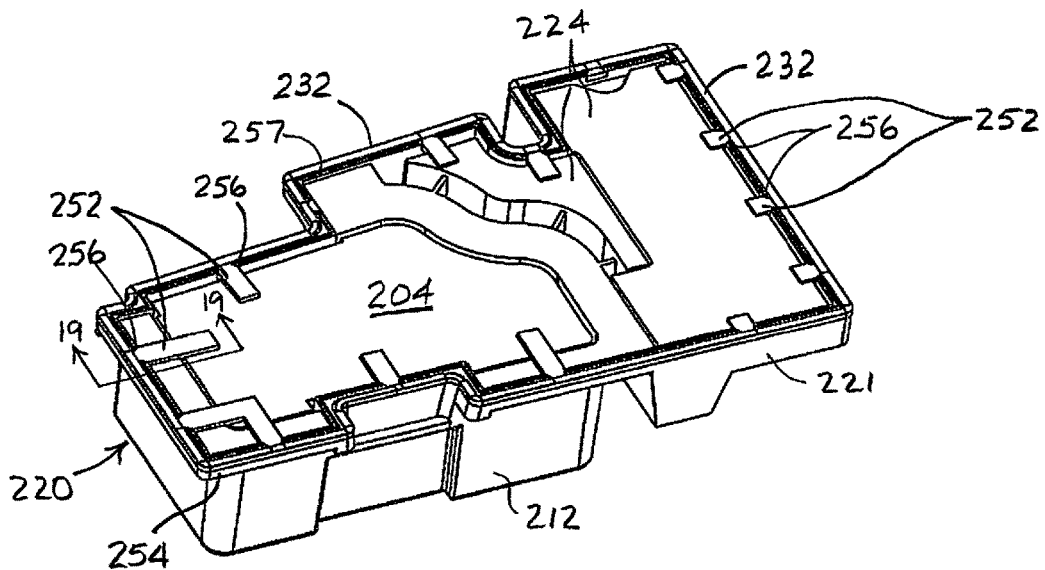
FIG. 18 is a frontal-top perspective view of the expanded assembled ballast of FIG. 15B with the lid removed to expose details of a gasket in an embodiment of the disclosure.
Figure 19:
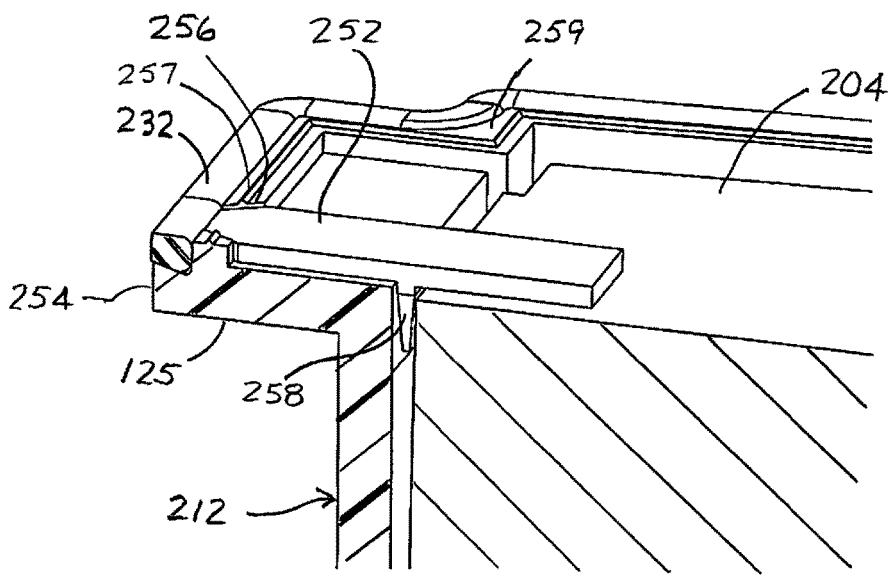
FIG. 19 is a partial sectional view of FIG. 18.
Figure 20:
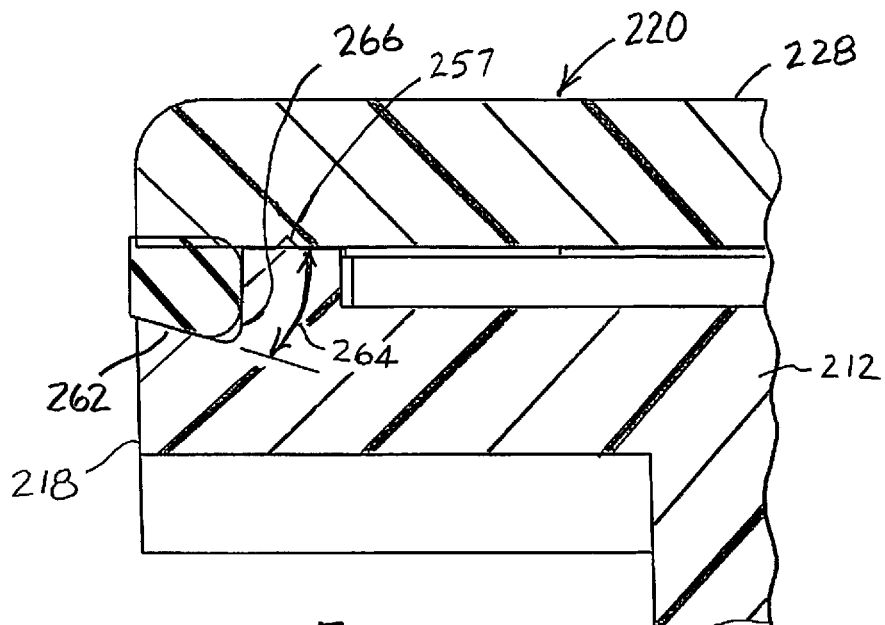
FIG. 20 is an enlarged, partial sectional view of the expanded assembled ballast of FIG. 15B in the vicinity of the gasket in an embodiment of the disclosure.

Referring to FIGS. 18 through 20, details of the gasket 232 of the expanded assembled ballast 32e are depicted in an embodiment of the disclosure. While the figures and attendant discussion present the gasket 232 of the expanded assembled ballast 32e, the same principles can be applied to the assembled ballast 32d. The gasket can include a plurality of tab portions 252 that extend inward. A rim 254 of the housing 220 that surround the tub portions 212, 221 can define a plurality of notches 256 that correspond in shape and placement to the tab portions 252. In one embodiment, an internal energy director 257, which can comprise a raised ridge of triangular cross-section, is disposed on an upward face 259 of the rim 254. Furthermore, in some embodiments, certain tab portions 252 can include shim portions 258 that extend downward between the weight(s) 204, 224 and the housing 220.

The gasket 232 can be housed in a gland 262 defined between the lid portion 228 and the tub portion 212. In one embodiment, the gland 262 defines a back angle 264 wherein the gland 262 is narrower at the exterior 218 of the housing portion 220 than at an interior perimeter 266 of the gland 262 (FIG. 20). The lid portion 228 can be attached to the tub portion 212 by a bonding process, such as ultrasonic welding.

Functionally, the gasket 232 of the expanded assembled ballast 32e isolates the weight(s) 204, 224 from the environment to prevent solution from entering the housing portions 202, 220 during wash cycles. The internal energy director 257 causes focused generation of welding flash during an ultrasonic welding operation, so that the welding flash is trapped either within the compartments 215, 222 or between the weld formed at the internal energy director 257 and the gasket 232. The tab portions 252 mate with the notches 256 to aid in placement of the gasket 232 during assembly. The shim portions 258 can take up tolerance gaps between the weight(s) 204, 224 and the housing 220 to prevent or inhibit rattling. The back angle 264 of the gland 262 assures that the gasket 232 is in sealing compression at the exterior 218 of the housing 220, while providing flow relief of the gasket 232 under compression that prevents or inhibits outward bulging of the gasket 232.

For the assembled ballasts 32d and 32e, the housing portions 202, 220 can be formed of conventional polymers such as polycarbonates, nylons, or fluoropolymers. The fabrication process can include, for example, an injection molding process, to provide the various features and aspects of the exterior 218 described of the housing portion 202, 220 above. The weight(s) 204, 224 can be simple, two-dimensional shapes (i.e., having contoured shapes on the x-y plane and being of uniform thickness in the z-direction) for ease of manufacturing by a variety of methods, including water jet, wire electro-discharge machining (EDM), and powdered metal. The compartment 215 of the housing portion 202, 220 can be configured to conform to these simple, two-dimensional shapes.

Figure 21:
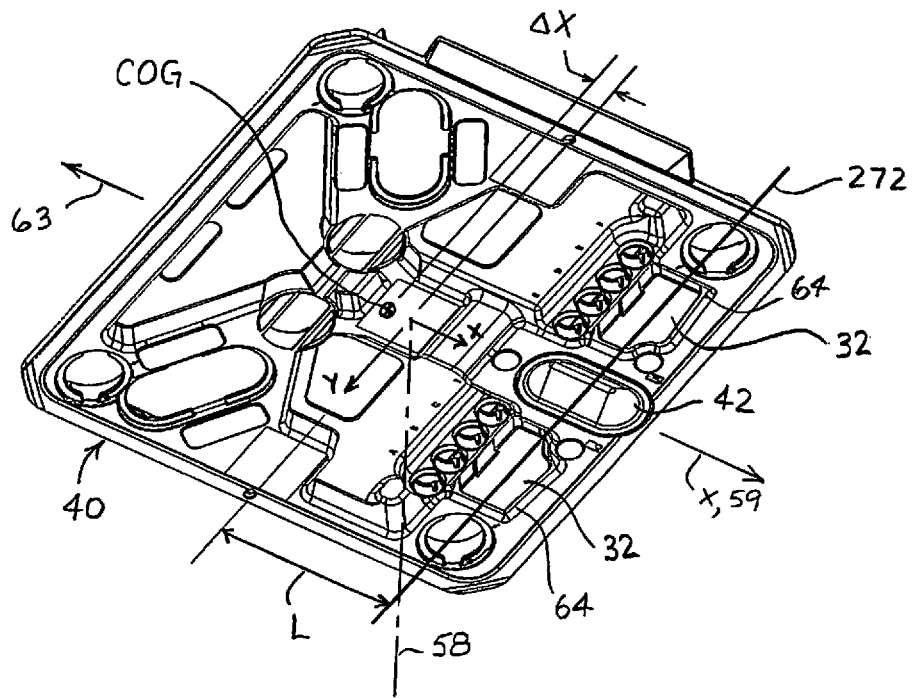
FIG. 21 is a rear-bottom perspective view of a kinematic coupling plate with ballast installed in an embodiment of the disclosure.

Referring to FIG. 21 and Table 1, the predicted effect of various ballasts 32 are presented for embodiments of the disclosure. Analytical models were developed to determine the effect of various configurations of the ballast 32 on the center of gravity of a fully assembled 450 mm Multiple Application Carrier (MAC) and a fully assembled 450 mm Front Opening Unified Pod (FOUP), both in an empty state (i.e., no wafers in the wafer container 30) and in a fully loaded state (i.e., a full complement of wafers 57 loaded in the wafer container). The fully assembled MAC and FOUP as modeled includes the removable door 36 secured within the door frame 54. For this analysis, the respective ballast 32 is characterized as having a weight W that is centered about a line 272 located a distance L from the central axis 58, the distance L being parallel to the x-axis. The weight W is expressed in units of kgf, which is defined as the weight of one kilogram of mass at standard gravity.

The resultant position of the center of gravity (COG) for the empty and full states of the two carriers are characterized by a location $\Delta X$ from the central axis 58, the location $\Delta X$ being parallel to the x-axis. Cast 304 stainless steel was modeled as the weight material 178 for the various ballasts 32 considered; powdered metal 316 stainless steel was also modeled for the expanded assembled ballast 32e. Herein, the weight W includes the weight of the entire ballasting arrangement, which includes the weight material 178 and any other structure that is part of the ballast 32 (e.g., the polymer material comprising the housing portions 202, 220 for the assembled ballasts 32d and 32e). It is noted that, for the expanded assembled ballast 32e embodiment, the weight W comprises the twin assembled ballast configuration (i.e., two ballasts 32e one for each of the receiving portion 64).

TABLE 1

Ballast performance analysis results

| Embodiment | L (mm) | W (kgf) | MAC $\Delta X$ (mm) Empty | MAC $\Delta X$ (mm) Full | FOUP $\Delta X$ (mm) Empty | FOUP $\Delta X$ (mm) Full | Weight Material |
|---|---|---|---|---|---|---|---|
| — | — | 0 | 42* | 24 | 52** | 30** | — |
| 32a | 171 | 1.77 | 17 | 10 | 22 | 14 | Cast 304 SS |
| 32d | 167 | 1.57 | 20 | 12 | 25 | 16 | Cast 304 SS |
| 32e | 171 | 1.83 | 16 | 10 | 21 | 13 | Cast 304 SS |
| 32e | 171 | 1.55 | 20 | 12 | 25 | 15 | Powdered Metal 316 SS |

*Exceeds maximum allowable $\Delta X$ of 39 mm for MAC
**Exceeds maximum allowable $\Delta X$ of 29 mm for FOUP For comparative purposes, the modeled MAC and FOUP assemblies were analyzed in both the empty and the full state without a ballast 32, to assess a baseline location $\Delta X$ of the COG without ballast compensation. The results, presented in Table 1 for W=0, indicate that the fully assembled FOUP is always outside the 29 mm limit allowed for $\Delta X$ under SEMI E158, and that fully assembled MAC is outside the allowable 39 mm allowed for $\Delta X$ under SEMI E159 when in the fully loaded state.

The results presented in Table 1 indicate that installation of any of the ballast embodiments modeled in the analysis puts the fully assembled FOUP and MAC in compliance with the SEMI standard.

Referring to FIG. 22, a retrofit kit 280 is depicted in an embodiment of the disclosure. In this embodiment, one or more of the various ballasts 32 depicted and described herein are provided in the retrofit, kit 280 for retrofitting to existing wafer containers 30. In one embodiment, the existing wafer container 30 is provided with appurtenances that accommodate the ballast 32 (e.g., the kinematic coupling plate 40 with receiving portions 64 having retention clips 78), with the ballast 32 being procured optionally or at a later time for ready installation. Optionally, the retrofit kit 280 can also include the kinematic coupling plate 40 having the various structural aspects describe above for retention of a given ballast 32, the kinematic coupling plate 40 being configured for connection to the wafer container 30 to replace an existing kinematic coupling plate, thereby affecting the retrofit. The retrofit kit 280 can further include instructions 282 that include, in whole or in part, the methods described herein for installing the kinematic coupling plate 40 and/or ballast 32 to the wafer container 30.

To retrofit a wafer container 30 with a ballast 32, the kinematic coupling plate 40 is removed from the wafer container 30, for example by loosening and removal of fasteners that attach the kinematic coupling plate 40 to the wafer container 30, and/or by prying of the kinematic coupling plate 40 from friction couplings disposed on the bottom panel 46 of the wafer carrier 30. Depending on which embodiment is utilized, the ballast 32 is then secured to the kinematic coupling plate 30, for example by the process described attendant to FIGS. 11A through 11D, or by the process described attendant to FIGS. 15 through 17. With the ballast 32 secured thereto, the kinematic coupling plate 40 is then mounted to the bottom panel 46 of the wafer carrier 30, thereby "sandwiching" the ballast 32 between the bottom panel 46 of the wafer container 30.

Referring to FIGS. 23A and 23B, a supply method 290 for providing ballasting is depicted as a flow chart in an embodiment of the disclosure. The supply method 290 involves a shipping party (i.e., an entity that manufactures or otherwise provides supplies wafers 57 and ships them via the wafer container 30) and a receiving party (i.e., an entity that receives the wafer containers 30 and attendant wafers 57) from the shipping party. The method 290 is divided into two sub-methods: 290*a* and 290*b*. Sub-method 290*a* is for execution by the shipping party, and sub-method 290*b* is for execution by the receiving party.

For sub-method 290*a*, the shipping party ships the wafer container 30 containing wafers 57 to the receiving party without the ballast 32 (step 293). It is noted that shipping party may, in some instances, have a first ballast 32 that is installed on the wafer container 30 for its own internal handling purposes (step 291), which is removed from the wafer container 30 (step 292) prior to shipping.

For sub-method 290*b*, the receiving party receives the wafer container 30 and wafers 57 from the shipping party (step 294) and installs a second ballast 32 onto the wafer container 30 (step 296) for subsequent handling and processing of the wafers 57. In one embodiment, the receiving party can remove the second ballast 32 (step 298) and return the wafer container 30 to the shipping party without ballast 32 (step 299).

In other embodiments, the kinematic coupling plate 40 and the ballast 32 are supplied as a unit. In this embodiment, the wafer container 30 is shipped sans the ballast 32. The receiving party then removes the kinematic coupling plate 40 and replaces it with the kinematic coupling plate 40 that includes the ballast 32 supplied as a unit. In another embodiment, the shell 34 of the wafer container 30 is shipped sans the kinematic coupling plate 40, and the kinematic coupling plate 40 with ballast 32 is installed by the receiving party.

Functionally, providing the ballast 32 for use by the receiving party can reduce shipping costs by shipping the wafer container 30 sans the ballast 32. Furthermore, the potential of container damage from impact shock that might occur during shipment due to the added weight of the ballast 32 is reduced. The ballast 32 can be retained by the receiving party and utilized in different wafer containers 30, further reducing costs by reducing the required number of ballasts 32 in inventory.

Figure 24:
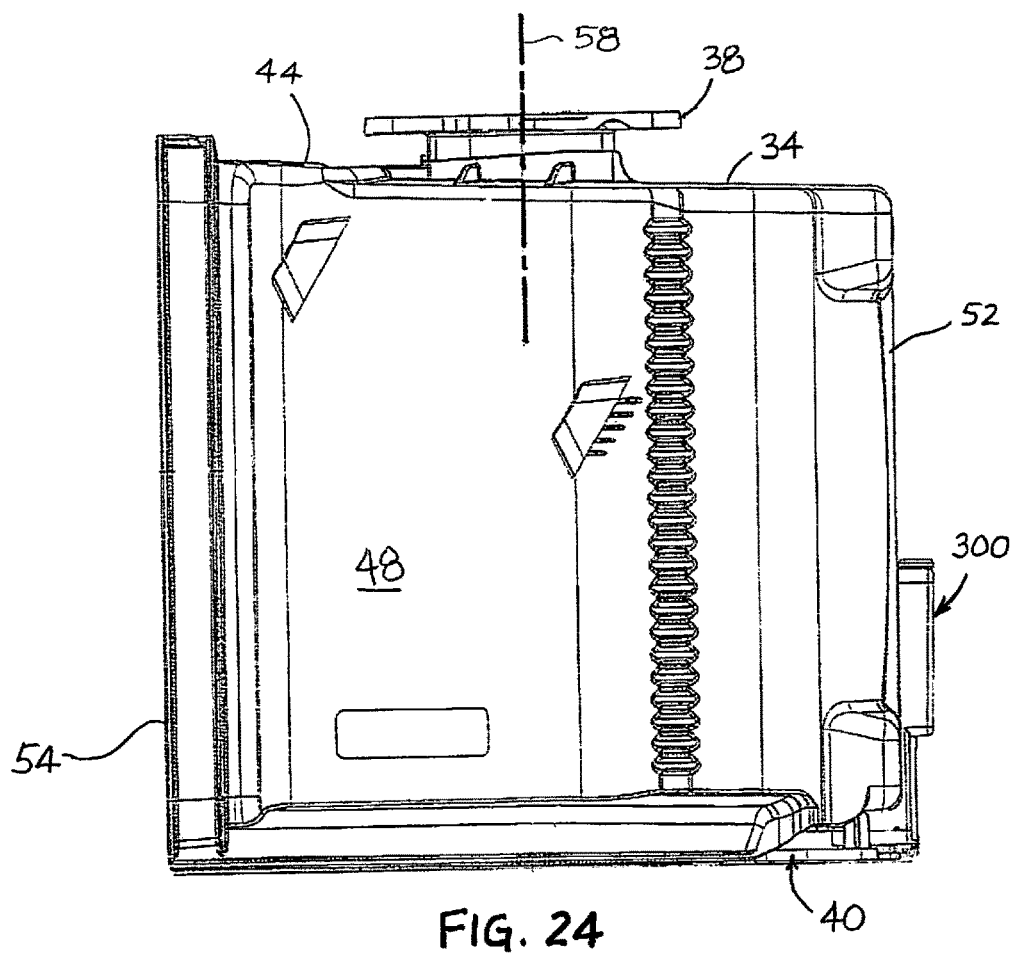
FIG. 24 is an elevation view of a wafer container with an external, rear-mounted ballast in an embodiment of the disclosure.
Figure 25:
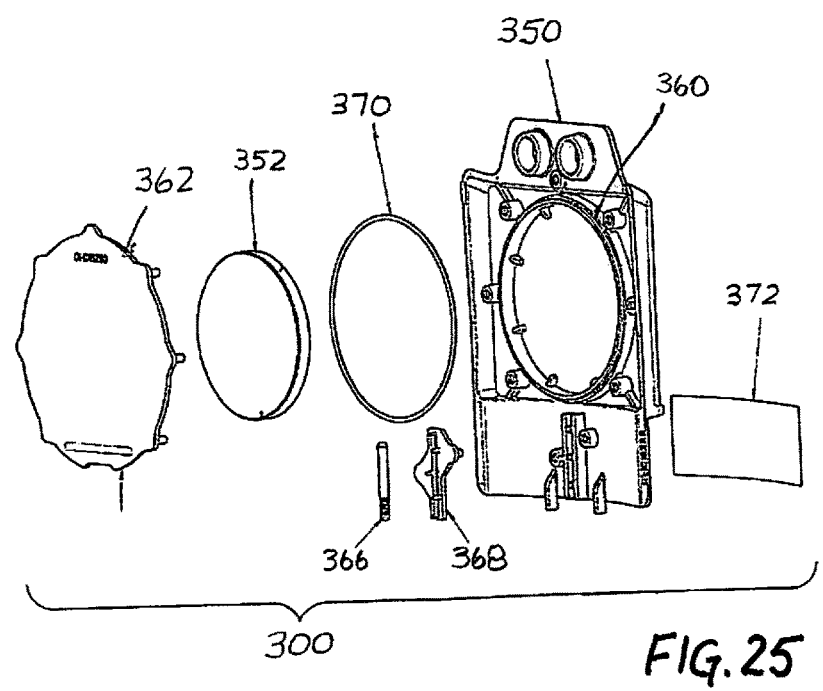
FIG. 25 is an exploded view of the external, rear-mounted ballast of FIG. 24 in an embodiment of the disclosure.

Referring to FIGS. 24 and 25, an exterior mounted ballast 300 is depicted in an embodiment of the disclosure. The exterior mounted ballast 300 is selected and sized to shift the center of gravity COG to within the specifications of the applicable SEMI standards. The ballast portion 300 can be part of an accessory 350 such as a card/RFID plate as illustrated. The ballast portion 300 generally comprises ballast material 352 encapsulated in an inert material such as many polymers typically used in semiconductor wafer containers. The encapsulation may comprise powder coating applied by conventional means, or may be a capsule 360 with a closure 362 sealed by an O-ring 370 to sealingly enclose the ballast material 352. An RFID capsule 366 can be configured for attachment to a bracket 368 as part of the accessory 350. The accessory 350 can also include an ID plate 372 including printed information about the container and/or its contents.

Figure 26:
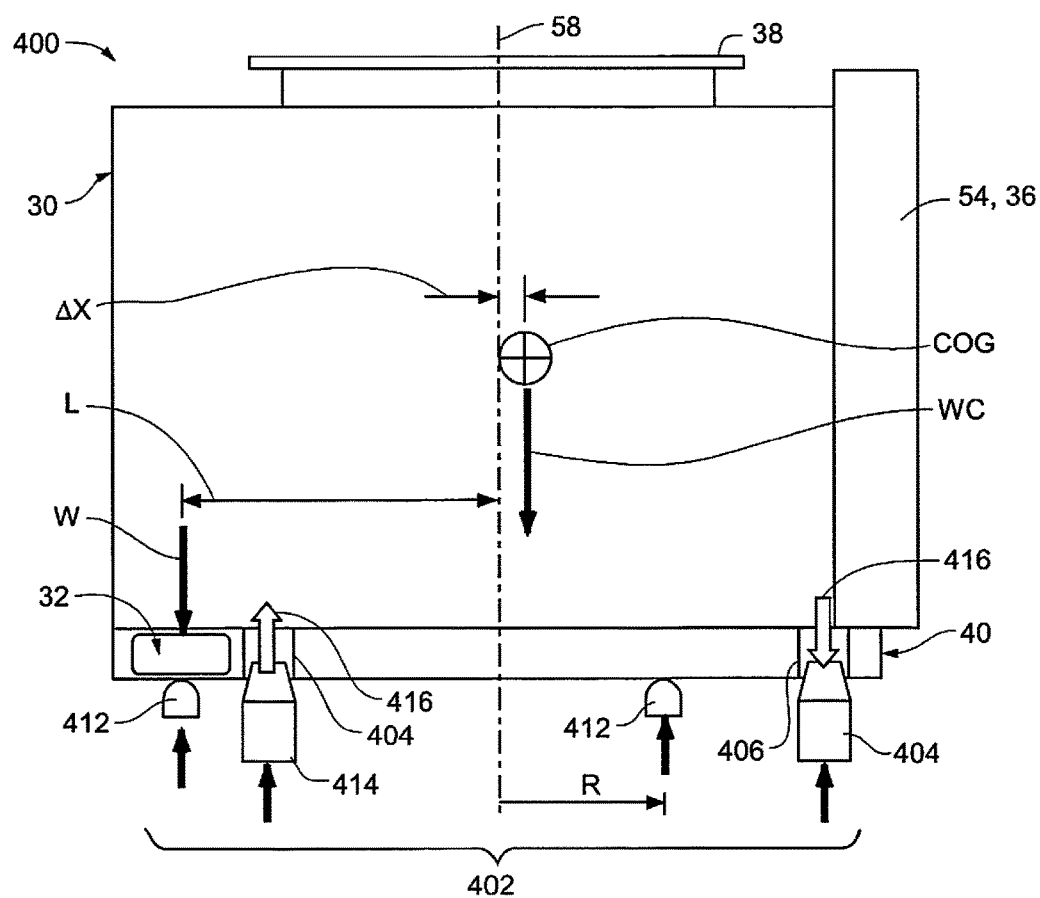
FIG. 26 is a schematic of a ballasted wafer container coupled with a purging device in an embodiment of the disclosure.

Referring to FIG. 26, a weighting system 400 for securing the wafer container 30 to a purge apparatus 402 is depicted in an embodiment of the disclosure. The wafer container 30 includes at least one inlet purge port 404 and at least one outlet purge port 406, each passing through the bottom panel 46 of the shell 34 and interfacing with the purge apparatus 402. The purge apparatus 402 includes kinematic coupling pins 412 and purge port couplings 414 that interface with the wafer container 30 via the kinematic coupling plate 40. In one embodiment, the purge apparatus is a stocker, which typically does not include an auxiliary hold down device. The wafer container 30 is further characterized as having the center of gravity COG at the distance ΔX from the central axis 58. The wafer container 30 can also include a ballast 32 such as depicted and described herein.

In operation, the wafer container 30 is mounted on the purge apparatus 402 so that the kinematic coupling pins 412 interface with the kinematic couplings 42 and the purge port couplings 414 are coupled with the purge ports 404, 406 to route a purge gas flow 416 through the wafer container 30. Prior to initiation of flow (zero flow condition), reaction forces FR are exerted on the wafer container 30 at the coupling points of the kinematic coupling pins 412 and the purge port couplings 414. The reaction forces FR for the zero flow condition are all positive (i.e., acting to maintain contact between the wafer container 30 and the purge apparatus 402) to counter a weight WC of the wafer container 30 and the weight W of the ballast 32.

The purge gas flow 416 is known to generate a lifting force on the wafer container. The lifting force is primarily at the inlet purge port(s) 404, but certain purge systems are also known to generate secondary lifting at the outlet purge port(s) 406. The lifting force generated by the purge gas flow 416 is proportional to the flow rate, and also depends somewhat on the purge interface of the wafer container 30; information relating the lifting force to the flow rate can typically be obtained from wafer carrier suppliers.

Under certain circumstances, the lifting force generated by the purge gas flow 416 can cause the reaction force FR to go negative at one or more of the kinematic coupling pins 412. Some purge apparatuses 402 include an auxiliary hold down device, such as a clamping hook, to counter negative reaction forces FR; however, other devices, such as most stockers, do not include an auxiliary hold down device. Furthermore, stockers tend to have kinematic coupling pins 412 positioned at smaller radii R relative to other process tools, which causes negative reaction forces FR to occur at lower lifting forces (i.e., at lower flow rates for the purge gas flow 416).

In one embodiment, the ballast 32 can be sized to counter a lift off of the wafer container 30 that would otherwise occur for excessive lifting forces. It is noted that the weight requirement for the ballast 32 to counter lift off often substantially exceeds the weight requirement for bringing the COG within SEMI specifications. Consider the modeled ballasts 32*a* and 32*e*, discussed attendant FIG. 21 and summarized at Table 1, and located at the distance L of 171 mm from the central axis 58. The minimum calculated required weight W of the ballast 32*a*, 32*e* to bring the FOUP embodiment within the ΔX of 29 mm requirement is approximately 1.2 kgf. However, to counter a purge gas flow 416 of nominally 100 liters per minute (LPM) where the radius R from the central axis 58 to the center of the kinematic coupling pins 412 is nominally 145 mm (typical of stockers), and assuming a lightly loaded wafer carrier (i.e., only a single resident wafer), the required weight W of the ballast 32*a*, 32*e* is predetermined to be approximately 2.4 kgf—fully twice the minimum required weight W for purposes of shifting the COG to within specified limits.

Accordingly, the ballasts 32 and 300 disclosed herein can be utilized in the weighting system 400 to secure wafer containers to purge apparatus without need for utilizing an auxiliary hold down device. Installation of ballasts 32 can be implemented using the retrofit kit 280 earlier described. In one embodiment, a correlation between the weight W of the ballast 32 sufficient to prevent lift off of the wafer container and the corresponding flow rate of operation for the purge gas flow 416 of the purge apparatus can be predetermined, and provided, for example, in the form of a chart or an equation. In one embodiment, the predetermined weight W vs. flow rate relationship is based on an empty or a nearly empty wafer container 30 (e.g., a wafer container containing only a single wafer). In one embodiment, ballasts 32 of the weight W of the ballast 32 predetermined to correspond to the corresponding flow rate of operation can be supplied as part of the retrofit kit 280.

The following documents, referred to above, are hereby incorporated by reference in their entirety: U.S. Patent Application Publication No. 2013/0032509 to Yamagishi et al.; WO 2011/072260 to Burns et al., commonly owned by the owner of the present application; SEMI E159-0912; SEMI E158-0912. The incorporation by reference is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly stated herein.

For convenience, the discussion above uses relative terms such as "upward", "downward", "forward", "rearward", "lateral", "horizontal", and "vertical." Unless otherwise indicated or readily inferred, these terms are not to be interpreted in the literal sense for all situations, but rather as being descriptive of the wafer container 30 when it is in the "upright" position (previously defined). It is noted that these directional and orientation descriptors bear a general relationship to the Cartesian coordinate system 60. That is: "upward" is a direction corresponding to the positive z-coordinate; "downward" is a direction corresponding to the negative z-coordinate; "rearward" is a direction corresponding to the positive x-coordinate; "forward" is a direction corresponding to the negative x-coordinate; "lateral" is a direction that generally extends along the y-coordinate; "horizontal" corresponds to a plane defined by the x- and -y coordinates; and "vertical" is a direction that generally extends along the z-coordinate.

Each of the additional figures and methods disclosed herein can be used separately, or in conjunction with other features and methods, to provide improved devices and methods for making and using the same. Therefore, combinations of features and methods disclosed herein may not be necessary to practice the disclosure in its broadest sense and are instead disclosed merely to particularly describe representative and preferred embodiments.

Various modifications to the embodiments may be apparent to one of skill in the art upon reading this disclosure. For example, persons of ordinary skill in the relevant art will recognize that the various features described for the different embodiments can be suitably combined, un-combined, and re-combined with other features, alone, or in different combinations. Likewise, the various features described above should all be regarded as example embodiments, rather than limitations to the scope or spirit of the disclosure.

Persons of ordinary skill in the relevant arts will recognize that various embodiments can comprise fewer features than illustrated in any individual embodiment described above. The embodiments described herein are not meant to be an exhaustive presentation of the ways in which the various features may be combined. Accordingly, the embodiments are not mutually exclusive combinations of features; rather, the claims can comprise a combination of different individual features selected from different individual embodiments, as understood by persons of ordinary skill in the art.

References to "embodiment(s)", "disclosure", "present disclosure", "embodiment(s) of the disclosure", "disclosed embodiment(s)", and the like contained herein refer to the specification (text, including the claims, and figures) of this patent application that are not admitted prior art.

For purposes of interpreting the claims, it is expressly intended that the provisions of 35 U.S.C. 112(f) are not to be invoked unless the specific terms "means for" or "step for" are recited in the respective claim.

What is claimed is:

1. A ballast system for a wafer container, comprising:
a ballast, including:
a first housing portion including a first tub portion and a first lid portion that cooperate to define a first main compartment; and a first primary weight comprising a weight material and disposed in said first main compartment, said first housing portion including a first exterior surface configured to be inserted into and coupled with a kinematic coupling plate of the wafer container, and wherein said ballast includes a first engagement portion configured to engage a retention feature on the kinematic coupling plate and wherein the first engagement portion is included on the first exterior surface of the first housing portion.

2. The ballast system of claim 1, wherein said ballast further comprises:
a second housing portion including a second tub portion and a second lid portion that cooperate to define a second main compartment; and
a second primary weight disposed in said second main compartment, said second housing portion including a second exterior surface configured to be inserted into and coupled with the kinematic coupling plate.

3. The ballast system of claim 2, wherein said first housing portion and said second housing portion are connected by a bridge structure.

4. The ballast system of claim 3, wherein said bridge structure is configured to accommodate a back side of a kinematic coupling on the kinematic coupling plate.

5. The ballast system of claim 1, wherein said first housing portion includes structure defining a flange portion that extends horizontally from said first tub portion.

6. The ballast system of claim 5, wherein said ballast further comprises contact features that depend from said flange portion.

7. The ballast system of claim 1, further comprising a gasket disposed interstitially between said first tub portion and said first lid portion, wherein:
said housing portion defines a plurality of notches; and
said gasket includes a plurality of tab portions, each of said tab portions mating with a corresponding one of said plurality of notches.

8. The ballast system of claim 1 comprising a gasket, wherein said first housing further defines a first supplemental compartment that houses a secondary weight, wherein said gasket extends between said first primary weight and said secondary weight.

9. The ballast system of claim 8, wherein said first supplemental compartment is configured to accommodate a back side of a kinematic coupling on the kinematic coupling plate.

10. The ballast system of claim 1, wherein said first engagement portion is further configured to engage the retention feature of the kinematic coupling plate of the wafer container with a snap connection.

11. A ballast system for a wafer container, comprising:
a ballast, including:
  a first housing portion including a first tub portion and a first lid portion that cooperate to define a first main compartment; and
  a first primary weight comprising a weight material and disposed in said first main compartment, said first housing portion including a first exterior surface configured to be inserted into and coupled with a kinematic coupling plate of the wafer container, wherein said ballast includes a first engagement portion configured to engage a retention feature on a kinematic coupling plate and said first engagement portion is a clip engagement portion including a lead-in structure and a catch surface.

12. The ballast system of claim 11, further comprising a kinematic coupling plate including a first receiving portion and a second receiving portion, at least one of said first receiving portion and said second receiving portion being shaped and dimensioned to receive said ballast, said kinematic coupling plate including a first retention clip coupled with said clip engagement portion.

13. The ballast system of claim 12, wherein said ballast includes a second engagement portion for engagement with a second retention feature on said kinematic coupling plate.

14. The ballast system of claim 13, wherein said second engagement portion is a second clip engagement portion including a lead-in structure and a catch surface.

15. The ballast system of claim 14, wherein said second retention feature is a second retention clip coupled with said second clip engagement portion, wherein said first retention clip is flexible in a first plane and said second retention clip is flexible in a second plane, said first plane being orthogonal to said second plane.

16. A wafer container, comprising:
  a shell having rear panel opposite a door frame, with a top panel, a bottom panel, and opposing side panels extending from said rear panel to said door frame, said door frame being sealingly engaged with a door;
  a robotic flange operatively coupled to said top panel of said shell, said robotic flange being centered about and normal to a central axis;
  a kinematic coupling plate operatively coupled with said bottom panel; and
  a ballast operatively coupled to said kinematic coupling plate proximate said rear panel, wherein said kinematic coupling plate includes at least one receiving portion shaped and dimensioned to receive said ballast.

17. The wafer container of claim 16, wherein said ballast includes:
  a first housing portion including a first tub portion and a first lid portion that cooperate to define a first main compartment; and
  a first primary weight comprising a weight material and disposed in said first main compartment, said first housing portion including a first exterior surface shaped and dimensioned for insertion into a first of said at least one receiving portion of said kinematic coupling plate.

18. The wafer container of claim 17, wherein said ballast further comprises:
  a second housing portion including a second tub portion and a second lid portion that cooperate to define a second main compartment; and
  a second primary weight disposed in said second main compartment, said second housing portion including a second exterior surface shaped and dimensioned for insertion into a second of said at least one receiving portion of said kinematic coupling plate.

19. The wafer container of claim 18, wherein said first housing portion and said second housing portion are connected by a bridge structure.

20. The wafer container of claim 19, wherein addition of said ballast to said wafer container moves a center of gravity of said wafer container to within 20 mm of said central axis.

* * * * *